United States Patent [19]
Lillja et al.

[11] Patent Number: 6,166,555
[45] Date of Patent: Dec. 26, 2000

[54] APPARATUS AND METHOD FOR SEATING AND/OR UNSEATING PRINTED CIRCUIT BOARDS IN A CHAMBER

[75] Inventors: Charles Lillja; David Roy Hugh, both of Houston, Tex.

[73] Assignee: Reliability Inc., Houston, Tex.

[21] Appl. No.: 08/949,749

[22] Filed: Oct. 14, 1997

Related U.S. Application Data

[60] Provisional application No. 60/028,379, Oct. 15, 1996.

[51] Int. Cl.[7] .......................... G01R 31/02; H01R 13/629
[52] U.S. Cl. ........................ 324/760; 324/158.1; 439/325
[58] Field of Search ...................... 324/758, 760, 324/158.1; 439/310, 325, 329; 438/17

[56] References Cited

U.S. PATENT DOCUMENTS

| | | | |
|---|---|---|---|
| 3,875,636 | 4/1975 | Schultz, Jr. et al. .................. | 29/203 B |
| 4,223,934 | 9/1980 | Cauceglia et al. ........................ | 294/15 |
| 4,447,948 | 5/1984 | Golinski et al. ........................... | 29/829 |
| 4,812,750 | 3/1989 | Keel et al. ............................... | 324/158 |
| 4,883,002 | 11/1989 | Schuster ................................... | 110/173 |
| 4,925,400 | 5/1990 | Blair et al. ............................... | 439/374 |
| 5,003,156 | 3/1991 | Kilpatrick et al. ...................... | 219/209 |
| 5,084,802 | 1/1992 | Nguyenngoc ............................ | 361/424 |
| 5,093,982 | 3/1992 | Gussman ......................... | 324/158.1 X |
| 5,193,998 | 3/1993 | Hack et al. .............................. | 432/250 |
| 5,265,328 | 11/1993 | Gorman .................................... | 29/829 |
| 5,359,285 | 10/1994 | Hashinaga et al. ..................... | 324/158 |
| 5,402,078 | 3/1995 | Hamilton ................................. | 324/760 |
| 5,509,193 | 4/1996 | Nuxoll ...................................... | 29/741 |
| 5,528,160 | 6/1996 | Fukumoto et al. ...................... | 324/760 |
| 5,650,732 | 7/1997 | Sakai ........................................ | 324/755 |

*Primary Examiner*—Glenn W. Brown
*Attorney, Agent, or Firm*—E. Randall Smith

[57] ABSTRACT

An apparatus for connecting and/or disconnecting at least one printed circuit board with at least one socket in a chamber, the printed circuit board being at least partially disposed within the chamber, includes at least one tool engageable with at least one printed circuit board and capable of moving the printed circuit board into or out of connection with at least one socket in the chamber, or both. At least one automated actuator is connected with the at least one tool.

60 Claims, 25 Drawing Sheets

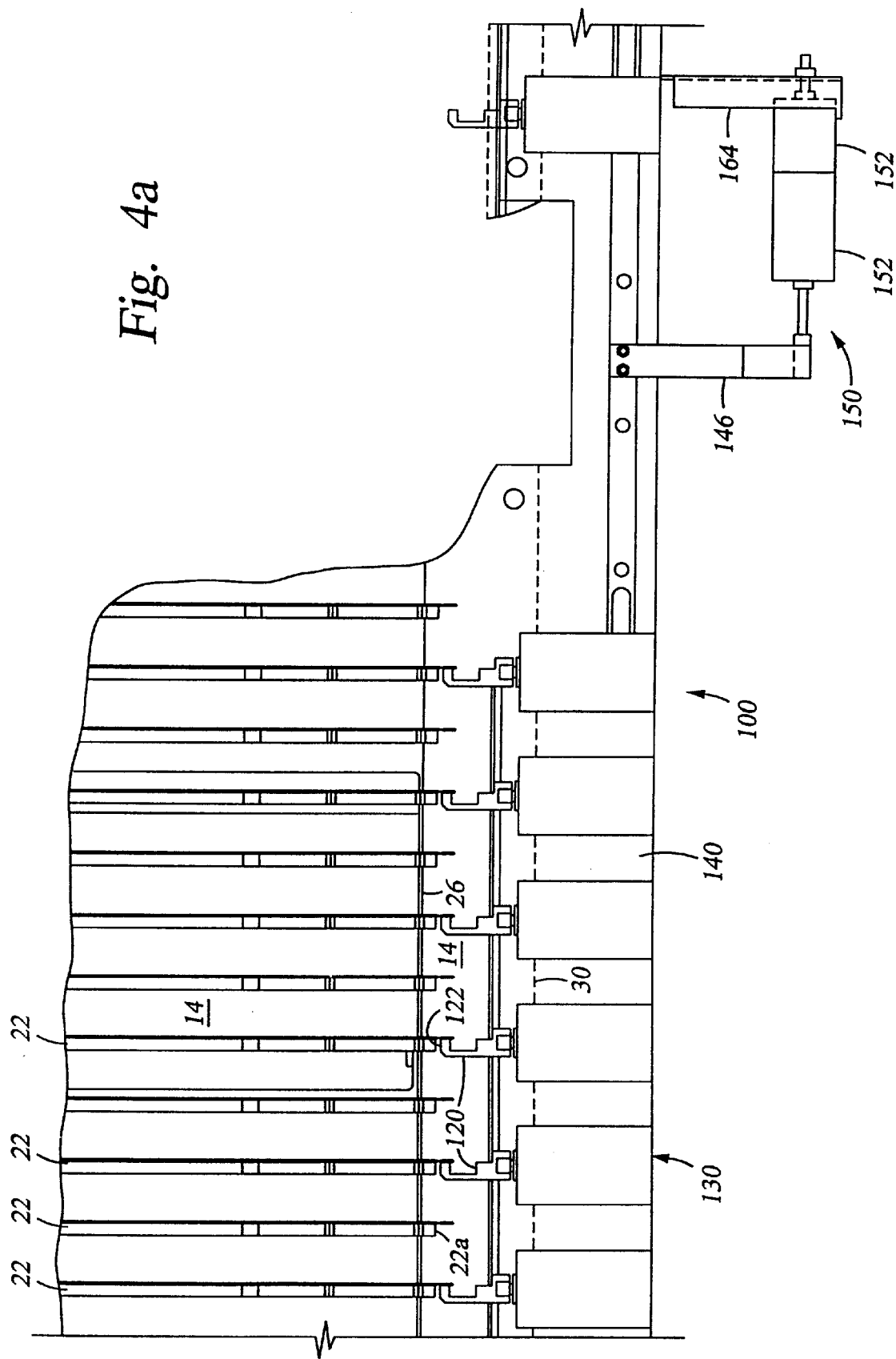

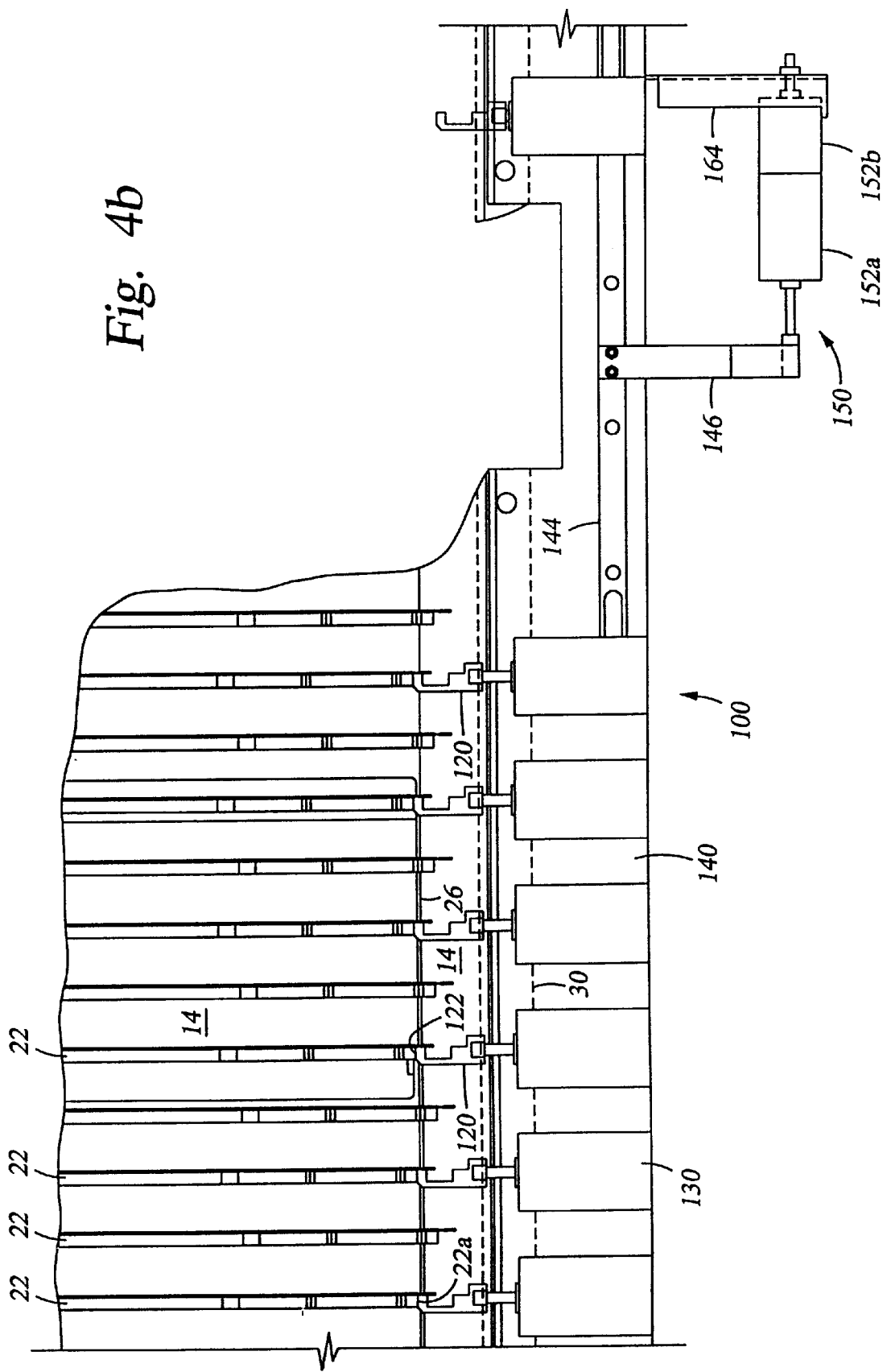

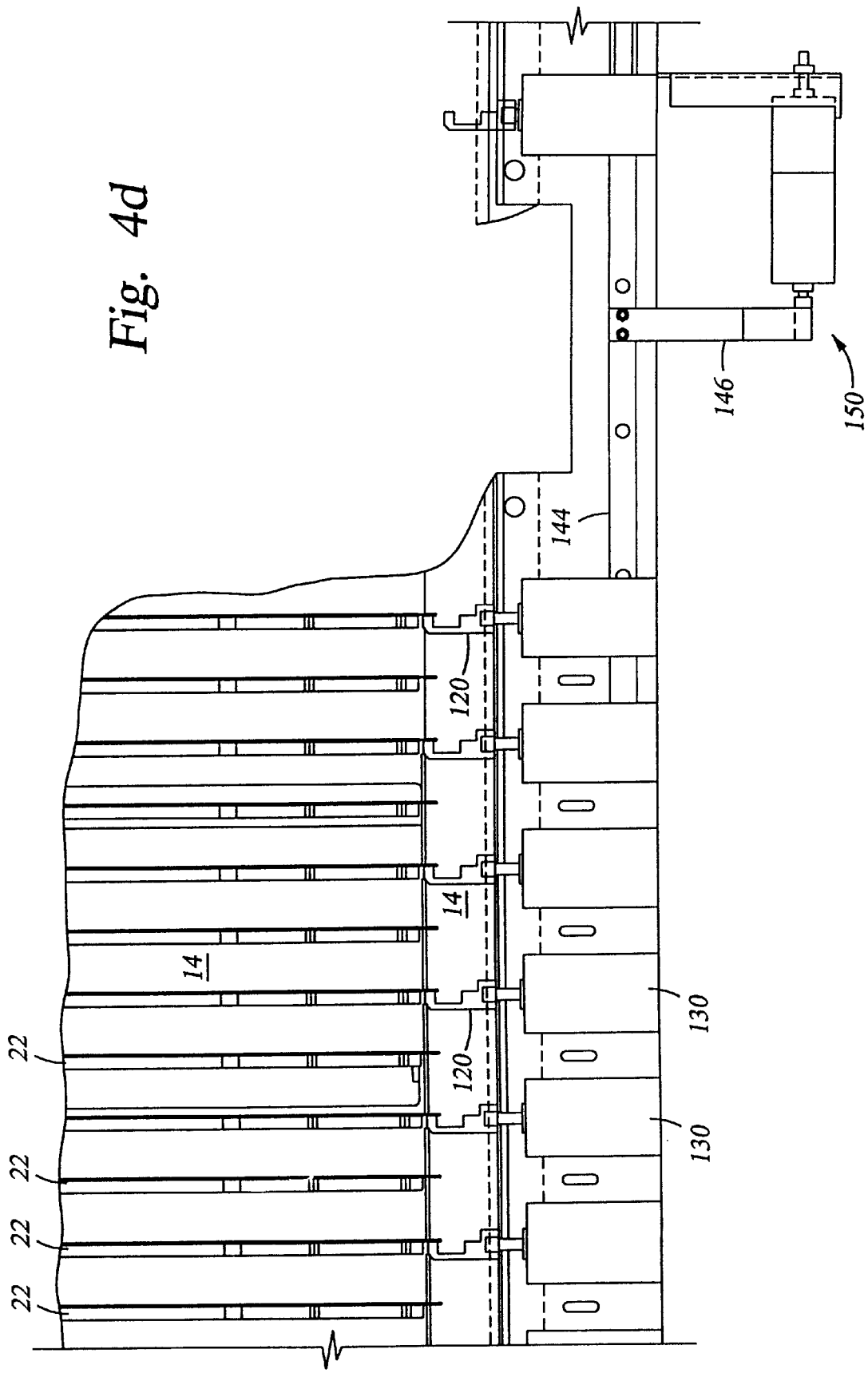

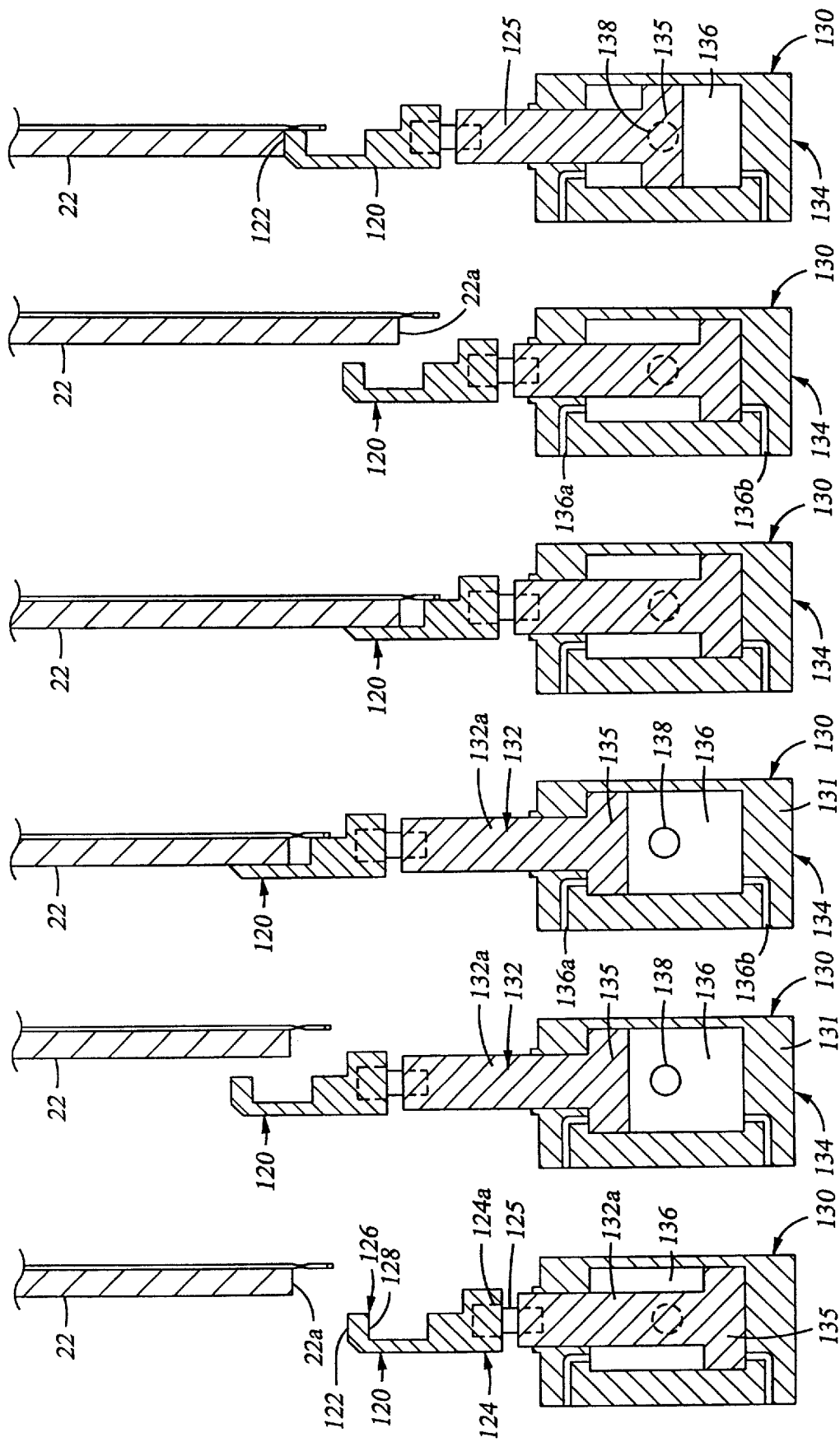

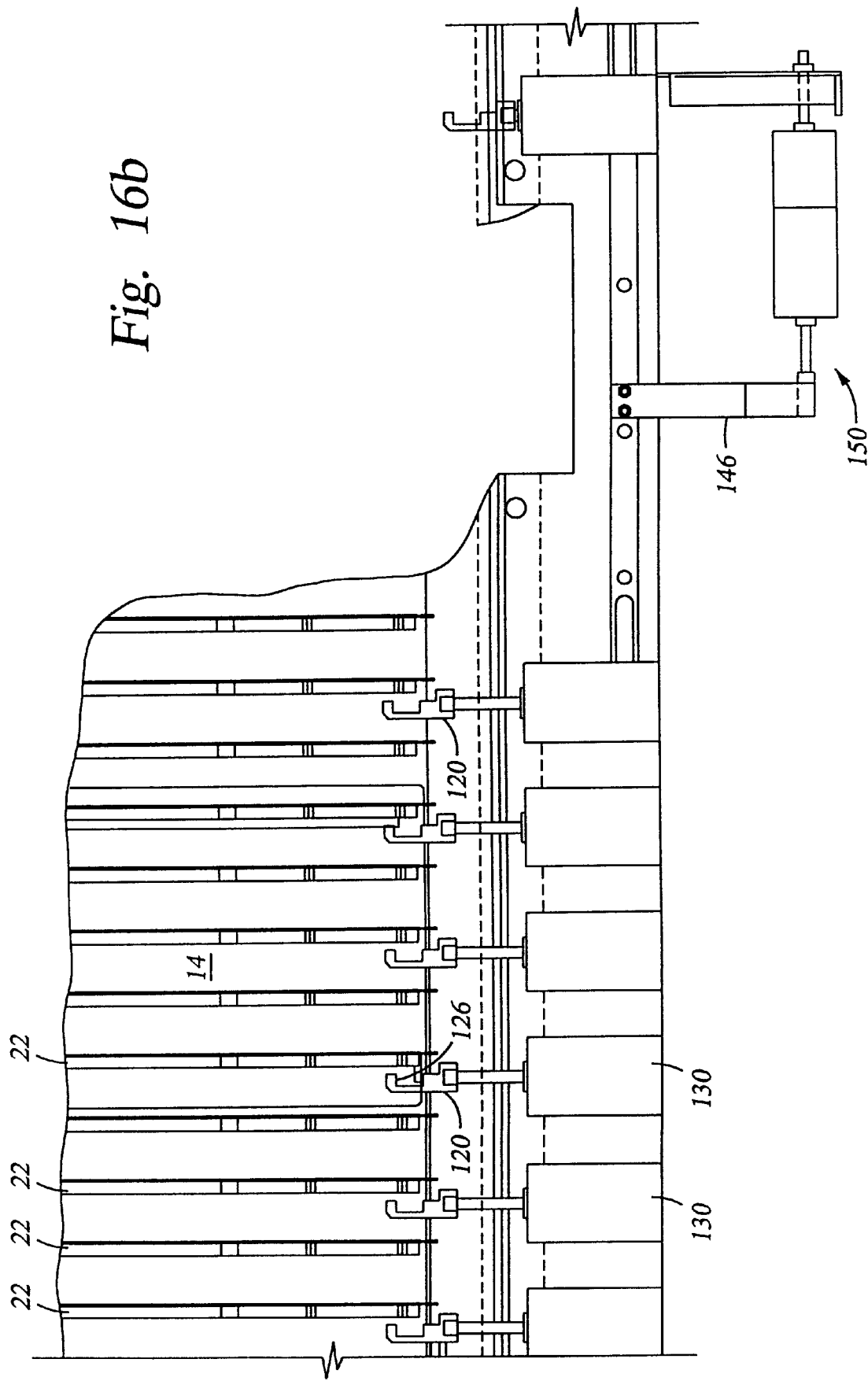

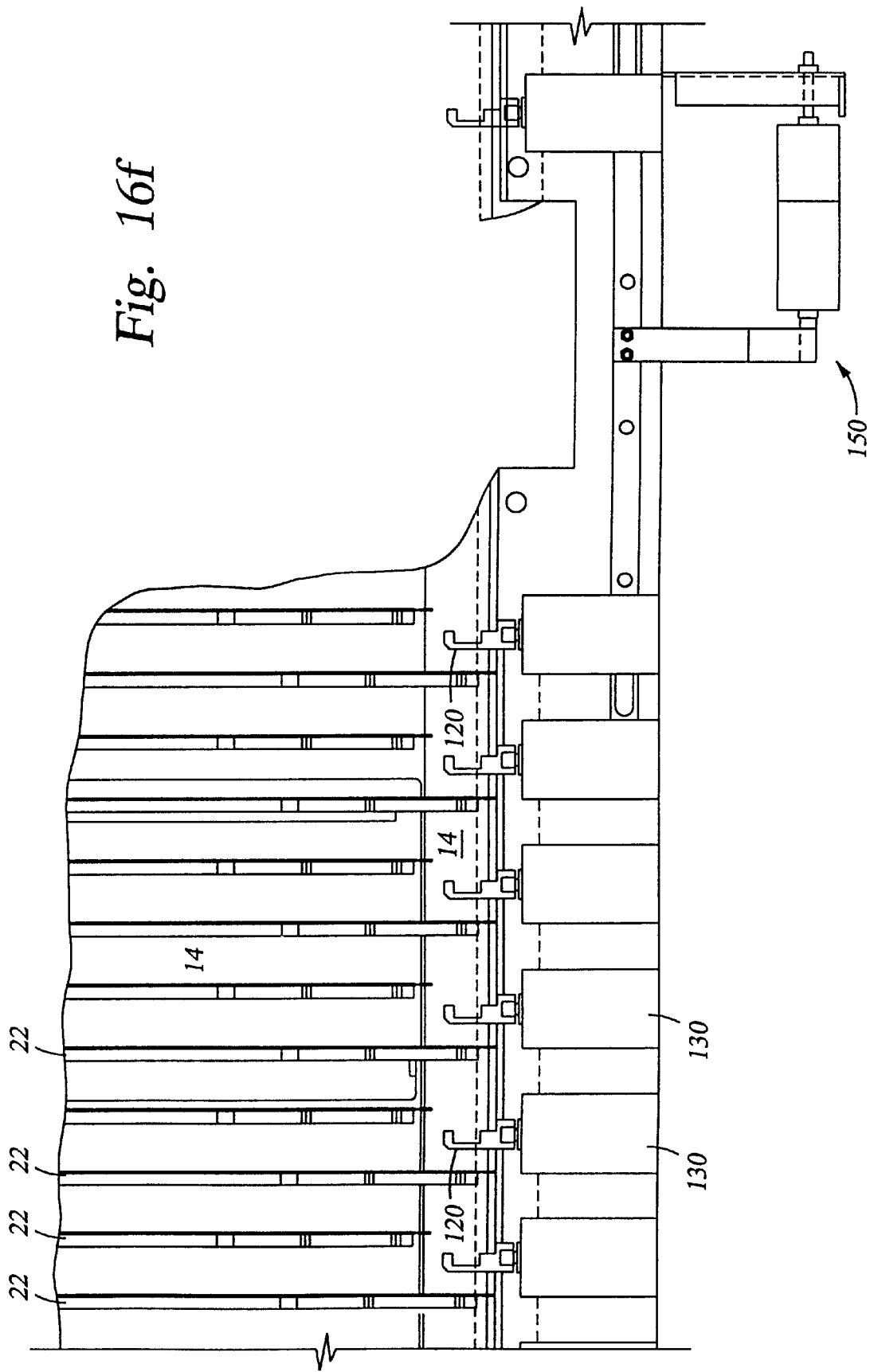

APPARATUS AND METHOD FOR SEATING AND/OR UNSEATING PRINTED CIRCUIT BOARDS IN A CHAMBER

This application claims the benefit of U.S. Provisional Application Ser. No. 60/028,379 filed Oct. 15, 1996.

STATEMENT REGARDING FEDERALLY SPONSORED RESEARCH AND DEVELOPMENT

Not applicable.

BACKGROUND OF THE INVENTION

The invention relates generally to the field of apparatus having environmentally controllable chambers, such as devices for stressing or testing electronic circuit components. More particularly, the present invention relates to a device for seating printed circuit boards into such apparatus, and still more particularly, to a device for automated seating and unseating of burn-in boards carrying circuit components within a burn-in chamber.

Integrated (IC) circuit packages and other semiconductor products are mass-produced and installed in electronic circuits within highly sophisticated, complex and costly equipment. As with many mass-produced products, IC packages are prone to failure, in some cases within the first one thousand hours of operation. The complexity of equipment within which such packages are installed makes post-installation failures highly undesirable. For example, when equipment reaches the final inspection stage of production, before failures are detected, the high level skills required for inspection and repair add a significant cost to production expenses. Even more significantly, when the product has been installed in the field and a service technician must make warranty repairs, the costs thereby incurred can have a significant effect on profitability. More and more often, however, post-installation failures simply cannot be tolerated because of the potentially disastrous consequences. As a result, manufacturers of electronic equipment are demanding ever greater quality and dependability in commercial grade IC packages.

Quality and dependability are enhanced substantially by early detection of those IC packages likely to fail early, prior to the installation of the IC packages in equipment. One method for detecting flawed IC packages is referred to as "burn in." "Burn-in" generally involves a technique for stressing and possibly also testing IC packages within their physical and electrical limits to discover IC packages that may be prone to early failure, or to enable the grading and sorting of IC packages according to performance specifications. One burn-in technique includes loading a large number of IC packages into sockets on numerous printed circuit, or burn-in boards; placing the burn-in boards into a housing with a chamber having an environment, particularly temperature, that is closely controllable; applying electrical test signals to each IC package on each burn-in board while uniformly subjecting the IC packages to the same temperature for a specific period of time; removing the boards from the chamber; and unloading the IC packages from the burn-in boards for sorting, distribution, and use or disposal.

Prior art burn-in chambers are shown, for example, in U.S. Pat. No. 5,359,285 to Hashinaga et al., and U.S. Pat. No. 5,003,156 to Kilpatrick et al. Typical prior art burn-in chambers have a front opening that allows access to the chamber and to racks for holding burn-in boards. An example of a "burn-in" chamber of the prior art holds up to seventy-two burn-in boards on racks disposed in the chamber, each board holding hundreds of IC packages. The chambers also typically include electrical connections in the rear of the chamber aligned with the racks for electrical source connection with the IC packages on the boards. For each burn-in board, there may be between 15 and 20 "spring clip" type electrical connections that must be engaged for burning-in the boards.

Various deficiencies and problems have been encountered with prior art techniques and devices used for seating and unseating burn-in boards in burn-in chambers. As used herein, the terms to "seat" and "seating" a burn-in board means moving the board that has already been placed in the chamber, such as on a burn-in board rack, into connection with the electrical ports in the rear of the chamber. Most prior art techniques are slow and not cost efficient. Typical techniques involve manually seating the boards, or using devices, such as, for example, crowbar type devices, that are cumbersome and can cause damage to the burn-in boards or chambers.

For example, seating a single burn-in board within corresponding electrical spring clip connectors typically requires a significant force, such as, in some cases, up to 90 pounds of force. As a result, manual seating of burn-in boards is difficult and time consuming. If the boards are seated with too great force, or are seated or unseated with improper alignment of the burn-in boards and electrical connections in the chamber, such as with the use of crowbar-like devices, the boards and connections are subject to damage and malfunctioning. Furthermore, unseating typically requires gripping the burn-in board and drawing, or pulling, the board outwardly, disconnecting the board from the electrical connections. Because the frames and faces of burn-in boards typically have sharp protrusions and edges, manual seating and unseating boards is dangerous and difficult. Similar problems exist with other types of chambered devices used for stressing and testing electronic circuit components and other types of devices having environmentally controllable chambers used with printed circuit boards.

Thus, there remains a need for a device and method for seating printed circuit boards, such as burn-in boards, in chambers that is quicker and more cost effective than previous devices and methods. Preferably, the seating device will be easy to operate, move between various positions and be capable of seating boards located at different heights within the chamber. Especially well received would be a seating device that can be automatically controlled and requires minimal operator assistance; and a seating device that requires minimal space around the chamber, such as a seating device that can be connected with and is vertically moveable with a vertically moveable chamber opening covering. Ideally, the seating device could also be used for unseating boards in the chamber, and can be used with a device having multiple chambers or chamber openings. Further, it would be beneficial for the seating device to be used to retrofit existing environmentally controllable chambers.

BRIEF SUMMARY OF THE INVENTION

In accordance with the present invention, there is provided an apparatus for connecting and/or disconnecting at least one printed circuit board with at least one socket in a chamber, the printed circuit board being at least partially disposed within the chamber. The apparatus includes at least one tool engageable with at least one printed circuit board and capable of moving the printed circuiot board into or out of connection with at least one socket in the chamber, or both. At least one automated actuator is connected with the at least one tool.

The apparatus may include a plurality of insertion tools and a plurality of insertion tool actuators, each insertion tool actuator connected with at least one insertion tool. Specifically, the apparatus may include twelve insertion tools. The insertion tools may be capable of substantially simultaneously engaging a plurality of burn-in boards, and each insertion tool may be independently engageable with a burn-in board.

The insertion tool actuator may include a piston, and may be capable of moving the insertion tool within a plane substantially parallel to the plane within which lies the central axis of a burn-in board disposed in the burn-in chamber. Furthermore, the insertion tool actuator may be capable of moving the insertion tool in at least two distinct positions within such plane.

In another aspect, the insertion tool may be rotatable between at least a first position wherein the insertion tool faces the interior of the burn-in chamber, and a second position wherein the insertion tool does not face the interior of the burn-in chamber. The apparatus may include an insertion tool rotation mechanism, which may include at least one cylinder, the cylinder having a reciprocating rod. The insertion tool may be rotatable with a range of approximately 90 degrees.

The insertion tool may be moveable laterally relative to the access opening of the burn-in chamber, and the apparatus may include an insertion tool translational movement mechanism. The insertion tool translational movement mechanism may include at least one piston, and may include first and second pistons. Furthermore, the insertion tool may be moveable between at least three lateral positions relative to the access opening of the burn-in chamber, and may be moveable between four distinct lateral positions relative to the access opening of the burn-in chamber.

The insertion tool may be disposed in a carrier connected with a burn-in chamber access opening covering. The insertion tool may be moveable vertically relative to the access opening of the burn-in chamber and may be moveable between at least three vertical positions relative to the access opening. The apparatus may include an insertion tool vertical movement mechanism, which may include a chamber opening covering actuator. The chamber opening covering actuator itself may include a motor, at least one chain guide rotatable by the motor, and at least one chain engageable with said chain guide. The apparatus may further have a shaft rotatable by the motor and a counterbalance spring associated with the shaft.

In one embodiment, the insertion tool is capable of moving at least one burn-in board out of connection with at least one electrical socket in the burn-in chamber, and the insertion tool may include a hook-like member engageable with at least one burn-in board.

Another embodiment of the invention involves an apparatus for electrically connecting at least first and second printed circuit boards with electrical sockets in a chamber, the chamber having an access opening and at least two printed circuit board holders disposed at different heights within the chamber, the first and second printed circuit boards being at least partially disposed within printed circuit board holders at different heights within the chamber. This embodiment includes a plurality of insertion tools moveable between at least two vertical positions relative to the access opening of the chamber. Each insertion tool is engageable through the access opening of the chamber with a printed circuit board and is capable of moving the printed circuit board into connection with at least one electrical socket in the chamber. At least one insertion tool actuator and an insertion tool vertical movement mechanism are connected with the plurality of insertion tools.

Yet another embodiment involves an apparatus for electrically connecting at least first and second printed circuit boards with electrical sockets in a chamber, the chamber having an access opening and at least two printed circuit board holders disposed at different heights within the chamber, the first and second printed circuit boards being at least partially disposed within printed circuit board holders at different heights within the chamber. This embodiment includes means for seating the printed circuit boards within electrical sockets in the chamber; actuation means for moving the seating means within the plane within which lies the central axis of at least one printed circuit board disposed in the chamber; vertical movement means for vertically moving the seating means between at least two vertical positions relative to the access opening of the chamber; and translational movement means for moving the seating means between at least two lateral positions relative to the access opening of the chamber. The seating means may include means for gripping at least one printed circuit board to unseat the printed circuit board from at least one electrical socket in the chamber. Rotational movement means may be included for rotating the seating means between at least two positions relative to the access opening of the chamber.

In accordance with the present invention, there is also provided a method for electrically connecting at least one printed circuit board with at least one electrical socket in a chamber, the printed circuit board being at least partially disposed within the interior of the chamber, the chamber having an access opening. The method includes aligning at least one insertion tool with at least one printed circuit board, extending the insertion tool through the access opening of the chamber to move the printed circuit board into connection with at least one electrical socket in the chamber, and extracting the insertion tool. The chamber may include at least a first and a second printed circuit board disposed at different vertical positions in the chamber, and the method may include moving the insertion tool between at least two vertical positions relative to the access opening of the chamber. The method may also include gripping at least one printed circuit board with the insertion tool, the printed circuit board being connected with at least one electrical socket in the chamber, and retracting the insertion tool to move the printed circuit board out of connection with the at least one electrical socket in the chamber.

In another embodiment, the present invention includes a method for electrically connecting a plurality of printed circuit boards with a plurality of electrical sockets in a chamber, the printed circuit boards being at least partially disposed within the interior of the chamber and positioned among at least two different heights within the chamber, the chamber having an access opening. This method includes aligning the plurality of insertion tools with a first set of printed circuit boards positioned at a first height in the chamber; extending each insertion tool through the access opening of the chamber to move the aligned printed circuit boards into connection with at least one electrical socket in the chamber; retracting the plurality of insertion tools; aligning the plurality of insertion tool with a second set of printed circuit boards positioned at the first height in the chamber; extending each insertion tool through the access opening of the chamber to move the aligned printed circuit boards into connection with at least one electrical socket in the chamber; and retracting the plurality of insertion tools.

The method of this embodiment may further include moving the plurality of insertion tools vertically relative to the chamber; aligning the plurality of insertion tool with a first set of printed circuit boards positioned at a second height in the chamber; extending each insertion tool through the access opening of the chamber to move each aligned printed circuit board into connection with at least one electrical socket in the chamber; retracting the plurality of insertion tools; aligning the plurality of insertion tool with a second set of printed circuit boards positioned at the second height in the chamber; extending each insertion tool through the access opening of the chamber to move each of the aligned printed circuit board into connection with at least one electrical socket in the chamber, and retracting the plurality of insertion tools. Furthermore, the method may include moving the plurality of insertion tools into a position wherein the plurality of insertion tools does not face the access opening of the chamber. Another activity this method may include is connecting the plurality of insertion tools with a chamber opening covering. Yet another activity of this method is vertically moving in unison the chamber opening covering and the plurality of insertion tools relative to the access opening of the chamber.

Accordingly, the present invention comprises a combination of features and advantages which enable it to substantially advance the technology associated with a device and method for seating printed circuit boards, such as burn-in boards, in chambers. Preferably, the seating device is easy to operate and to move between various positions and is capable of seating boards located at different heights within the chamber. The present invention may be configured to be automatically controlled and require minimal operator assistance and to require minimal space around the chamber, such as by being connected and vertically moveable with a vertically moveable chamber opening covering. The seating device may also be configured for unseating boards in the chamber; be used with a device having multiple chambers or chamber openings; and may be used to retrofit existing environmentally controllable chambers. The characteristics and advantages of the present invention described above, as well as additional features and benefits, will be readily apparent to those skilled in the art upon reading the following detailed description and referring to the accompanying drawings.

BRIEF DESCRIPTION OF THE DRAWINGS

For a detailed description of the preferred embodiments of the invention, reference will now be made to the accompanying drawings wherein:

FIGS. 4a–d are top, isolated, partial views of an embodiment of numerous insertion tools and insertion tool actuators and a translational movement mechanism made in accordance with the present invention shown seating numerous burn-in boards within a chamber.

FIGS. 5a–f are cross-sectional views showing various positions that can be assumed by a preferred embodiment of an insertion tool and insertion tool actuator made in accordance with the present invention.

FIGS. 16a–f are top, isolated, partial views of an embodiment of numerous insertion tools and insertion tool actuators and a translational movement mechanism made in accordance with the present invention shown unseating numerous burn-in boards within a chamber.

DETAILED DESCRIPTION OF THE PREFERRED EMBODIMENTS

Figure 1:
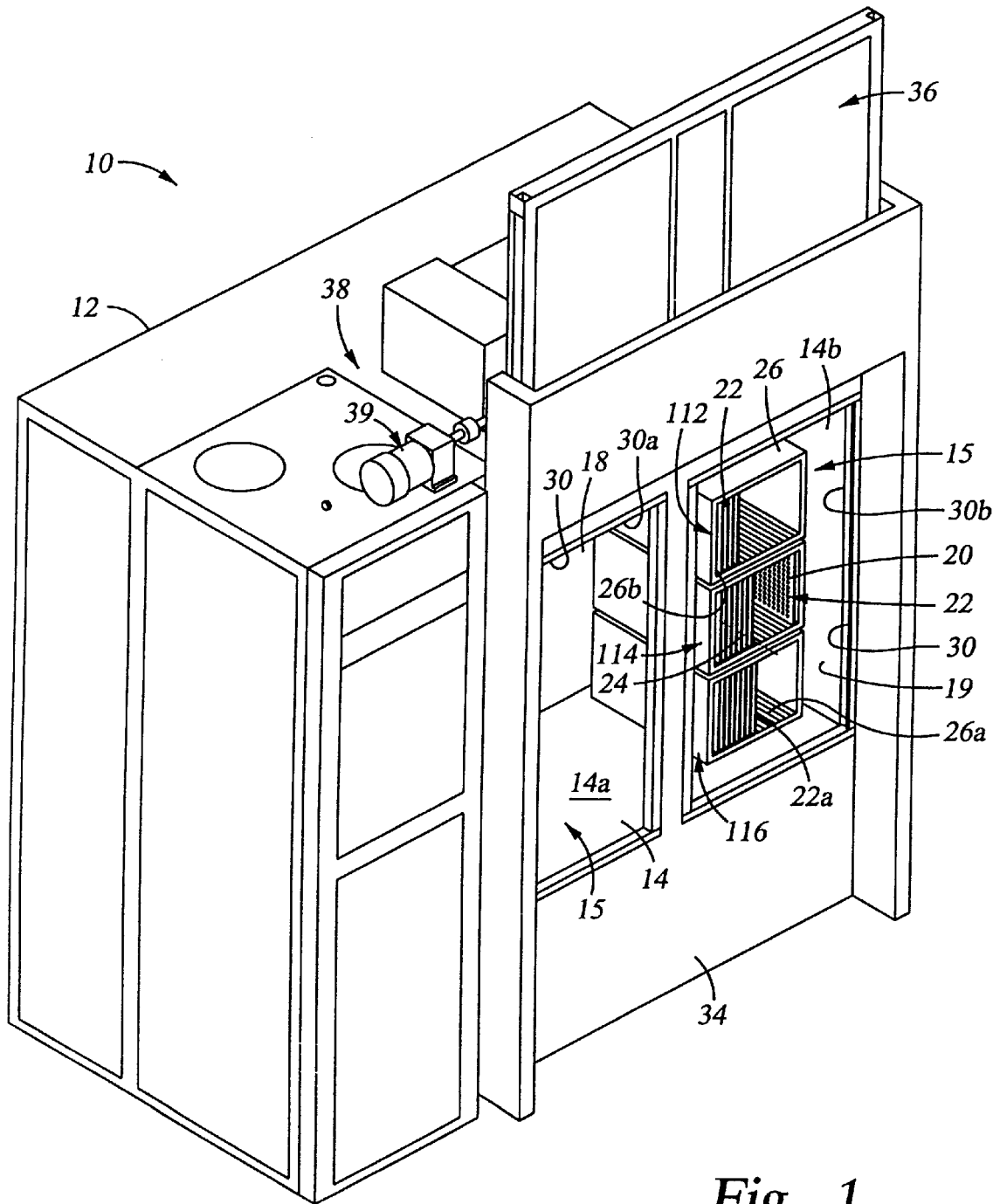
FIG. 1 is an isometric view of an embodiment of a device for burning-in circuit components having a burn-in chamber useful with the present invention.

The presently preferred embodiments of the invention are shown in the above-identified figures and described in detail below. In describing the preferred embodiments, like or identical reference numerals are used to identify common or similar elements. The figures are not necessarily to scale and certain features and certain views of the figures may be shown exaggerated in scale or in schematic form in the interest of clarity and conciseness.

Referring initially to FIG. 1, there is shown a burn-in device 10 having a housing 12 with an insulated, substantially airtight, environmentally controllable chamber 14. The chamber 14 is useful for testing, or burning-in, IC packages. 20 disposed on burn-in boards 22, as is known in the art. For example, the device may hold seventy-two boards 22, each board capable of holding up to numerous hundreds of IC packages 20. The burn-in boards 22 are either situated directly on racks 26 disposed within the chamber 14, or placed in groups of boards 22 onto cartridges (not shown) likewise mountable on the racks 26, as is known in the art. The rear wall 18 of the chamber 14 has electrical ports, or sockets, 108 (FIGS. 14a–e) aligned with the racks 26 for connection with the burn-in boards 22 for providing and monitoring electrical signals to the IC packages 20 on the boards 22, as is known in the art.

Still referring to FIG. 1, access to the interior 15 of the chamber 14 is provided through one or more openings 30 in the front wall 34 of the housing 12, the exemplary chamber 14 including left and right openings 30a, 30b. A left portion 14a of the chamber 14 is thus accessible through the left opening 30a, and a right portion 14b accessible via the right opening 30b. The chamber openings 30 are covered and uncovered with one or move removable coverings, or access doors 36. The single covering 36 shown in FIG. 1 is moveable vertically between open and closed positions over the openings 30 with a covering actuator 38. An example of a covering and covering actuator compatible for use with the burn-in device 10 and the present invention as will be described below are disclosed in U.S. patent application Ser. No. 08/950,285, filed on Oct. 14, 1997, now U.S. Pat. No. 6,017,215, having common inventors and a common assignee with the present application, and hereby incorporated by reference in its entirety. Although the covering and covering actuator of application Ser. No. 08/950,285 (U.S. Pat. No. 6,017,215) are referenced herein in connection with the description of a preferred embodiment of the present invention, the present invention is not limited to use with such apparatus. Furthermore, it should be understood that although a preferred embodiment of the present invention is described herein with respect to a single chamber 14, dual opening 30, burn-in device 10, the present invention may be used with multiple chamber burn-in devices, devices with one or numerous chamber openings, as well as other types of devices for stressing or testing electronic circuit components.

As shown in FIG. 1, the right portion 14b of the exemplary chamber 14 includes three burn-in board racks 26 accessible through the right opening 30b. Each rack 26 has slots, or positions, for a particular number of boards 22. The rack 26 shown used with the preferred embodiment of the present invention holds a total of twelve boards 22. Three similar racks (not shown) accessible through the left opening 30a are disposed in the left chamber portion 14a in generally parallel alignment with the racks 26 in the right chamber portion 14b, forming an upper 112, a middle 114 and a lower 116 row of burn-in boards 22 in the chamber 14. Each row 112, 114 and 116 thus holds a total of 24 burn in boards 22. For purposes of the discussion which follows, the boards 22 in any row will be divided into two sets; the "odd numbered" and "even numbered" boards based on their positions in the chamber 14 from the far left of the chamber 14 assuming the chamber 14 is filled to capacity.

Figure 2:
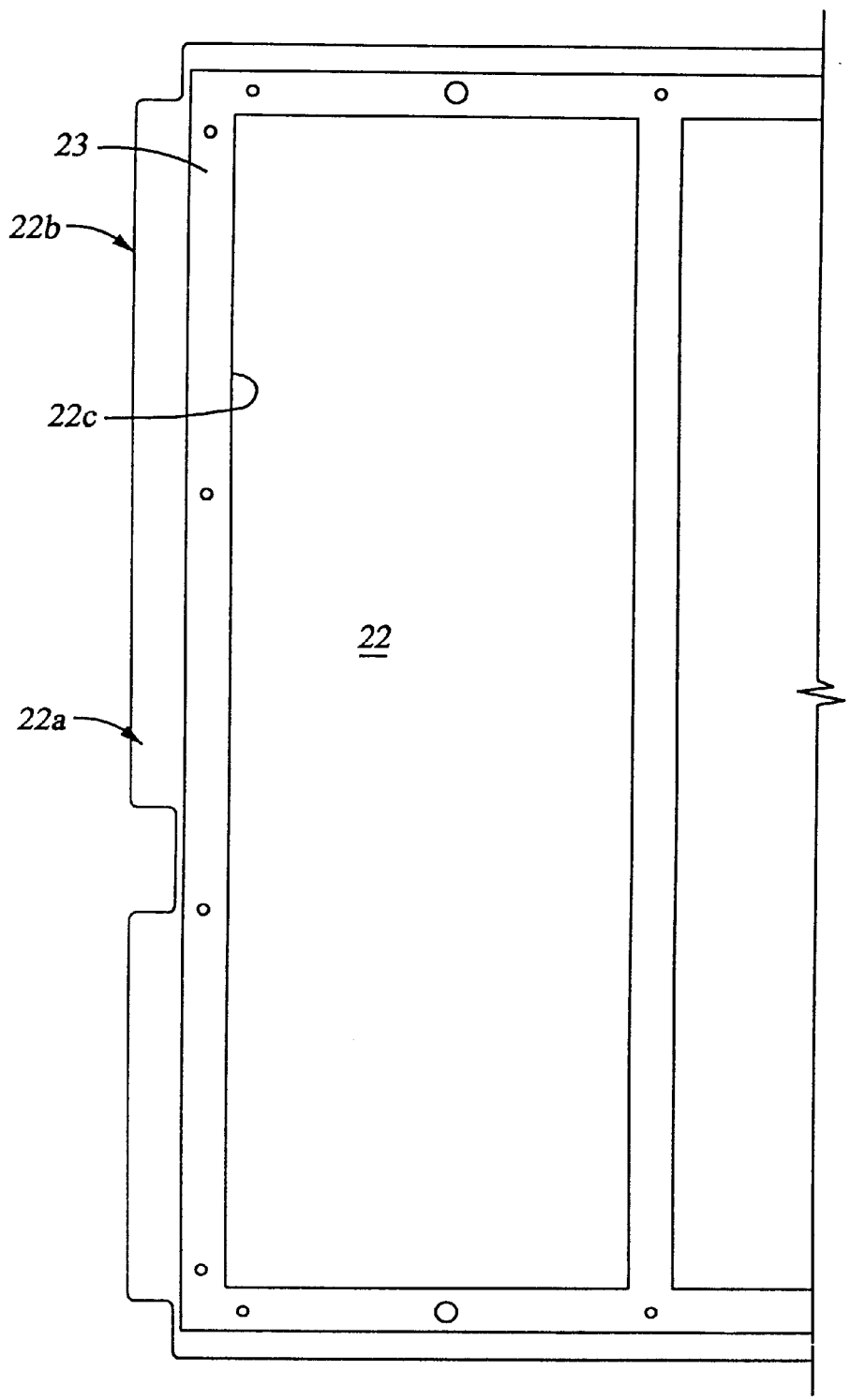
FIG. 2 is a partial plan view of a conventional burn-in board.

The boards 22 are positioned vertically in generally parallel spaced relationship to one another in the chamber 14, each board having a side 22a facing the chamber opening 30. Thus, the central axes 24 of all boards 22 in the chamber 14 lie in generally parallel vertical planes. The burn-in boards or other printed circuit boards may be any suitable commercially available conventional boards. As shown in FIG. 2, each board 22 has a sturdy frame 22b capable of withstanding the forces necessary for seating and unseating within a chamber, such as with the use of the present invention as will be described below. As used herein, the terms to "seat" and "seating" a burn-in, or other printed circuit, board means moving the board that has already been placed in the chamber, such as on a chamber rack, into connection with the electrical ports in the rear of the chamber. Along side 22a, the frame 22b preferably includes a lip 22c, such as is formed by the inside surface (not shown) of a stiffener 23 on the frame 22b.

Referring again to FIG. 1, depending on the configuration of the racks 26 and their positioning in the chamber 14, each board 22 is positioned a fixed distance from adjacent boards 22 and from the left (not shown) and right side chamber walls 19, as is known in the art. For example, adjacent boards 22 on each rack 26 may be spaced approximately 1½ inches apart, boards 22 disposed in the outermost board positions 26a on racks 26 spaced approximately 2 inches from the side chamber walls 19, and boards 22 disposed in the innermost board positions 26b on adjacent racks may be spaced approximately 12.75 inches from one another. It should be understood, however, that this exemplary spacing, although preferred with the use of the preferred embodiment of the invention described herein, is not necessary for practice of the present invention; any other suitable spacing could instead be used.

The construction, configuration and operation of the boards 22, racks 26 and cartridges (not shown) and ports 108 suitable for use with the present invention may take forms and configurations other that as described above. Furthermore, the operation of such components and other components of the burn-in device 10 necessary for enabling burning-in and testing of the IC packages, such as a power supply, electronic circuitry, computer software and hardware, control mechanisms, air heaters and air blowers, are well known in the art.

Figure 3:
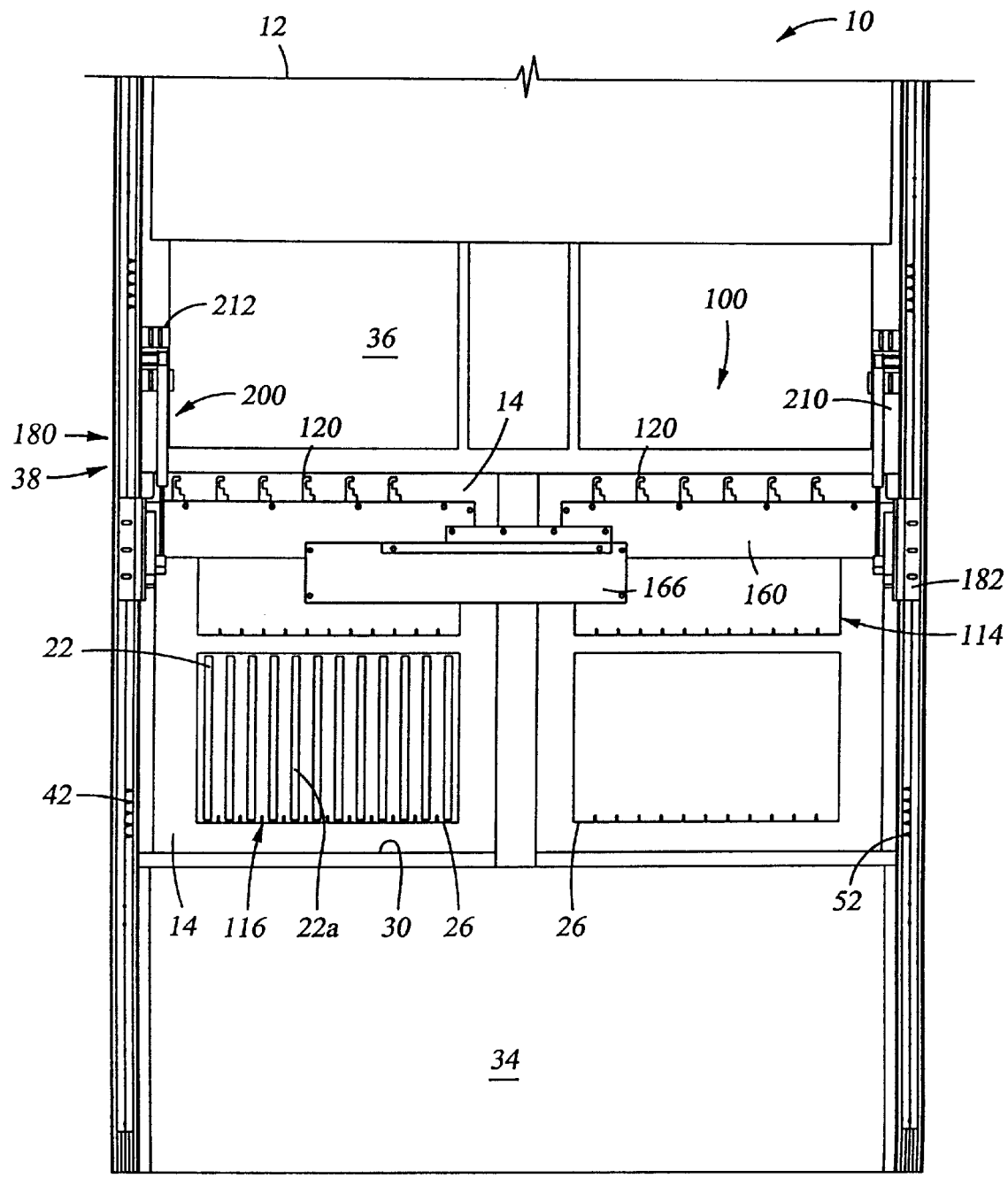
FIG. 3 is a partial front view of the device of FIG. 1 showing a first embodiment of a burn-in board seating device made in accordance with the present invention.

As shown in FIG. 3, the present invention is directed to a seating device 100 for seating burn-in boards 22 in chamber 14. The seating device 100 of the present invention generally includes at least one burn-in board insertion tool 120, an insertion tool actuator 130 (FIG. 4a), a translational movement mechanism 150 (FIG. 4a) and a vertical movement mechanism 180.

Now referring to FIG. 5a, the insertion tool 120 includes a surface, or face, 122 with which the insertion tool 120 engages a burn-in board 22. The insertion tool 120 also has a connection portion 124 where the insertion tool 120 is connected with the insertion tool actuator 130. In the preferred embodiment, the connection portion 124 includes a grooved aperture 124a matable with an insertion tool actuator rod 132a, such as with a double male connector 125. However, other conventional connectors may be used for connecting the insertion tool 120 and insertion tool actuator 130.

The insertion tool 120 engages and seats burn-in boards 22. The insertion tool 120 must thus be constructed of material capable of withstanding the forces encountered during seating of burn-in boards 22. As used herein, the term "insertion tool" means a device formed of any suitable material, shape and configuration; is engageable with a printed circuit board or burn-in board; possess sufficient load bearing capabilities to withstand forces associated with seating of such boards; is movable between at least two positions; and is otherwise compatible for use as part of a seating device made in accordance with the present invention. Further, the term "insertion tool actuator" as used herein, means a device formed of any suitable material and with any shape or configuration capable of moving an insertion tool made in accordance with the present invention into and out of engagement with at least one burn-in or printed circuit board; providing the force necessary for seating at least one such board; having the strength characteristics for withstanding forces associated with such seating; and is otherwise compatible for use with the present invention.

Still referring to FIG. 5a, the insertion tool 120 may also be equipped with a burn-in board retractor 126 and therewith be capable of unseating PC or burn-in boards 22 in a chamber 14 (FIG. 3). As used herein, the term "unseating" means moving a PC or burn-in board out of connection with electrical ports in a chamber. The burn-in board retractor 126 of the preferred embodiment is a hooked portion 128. However, it is not essential that the insertion tool 120 of the present invention have a burn-in board retractor 126 and be capable of unseating burn-in boards 22.

Now referring to FIGS. 5b and 5c, the insertion tool actuator 130 of the preferred embodiment includes an insertion tool carrier 132, such as the insertion tool actuator rod 132a, that is connected to the insertion tool 120. The carrier 132 and attached insertion tool 120 are moveable by a drive mechanism 134 between at least two positions within planes parallel to the planes within which the central axes 24 (FIG. 1) of the bun-in boards 22 lie. In the preferred embodiment, the drive mechanism 134 includes a housing 131 containing a pneumatic piston 135 connected to the insertion tool actuator rod 132a. The piston 135 is caused to reciprocate within a piston chamber 136 by selective input and discharge of pneumatic pressure through passages 136a, 136b. Any commercially available pneumatic piston device suitable for use with the present invention, such as SMC Part Number NCDQ2, may be used. Likewise, the drive mechanism 134 may take any other suitable form, such as a hydraulic piston or electrically actuated linear motion transferring device.

Referring to FIGS. 5a–e, the insertion tool actuator 130 of the preferred embodiment is capable of moving the insertion tool 120 between, and holding the insertion tool 120 at each of, three distinct positions. In the first position, as shown in FIGS. 5a, 5d and 5e, the piston 135 is in its rearmost position in the piston chamber 136, causing the actuator rod 132a and insertion tool 120 to be in a "retracted axial" position. This position is useful for seating and unseating. In the second position, illustrated in FIG. 5f, the piston 135 is disposed in an intermediate position in the piston chamber 136, causing the actuator 132a and insertion tool 120 to be in an "intermediate axial" position. Movement of the insertion tool 120 into this position from the retracted position enables seating of a board 22. The third position, shown in FIGS. 5b and 5c, is useful for unseating burn-in boards 22. In this position, the piston 135 is at its forward position in the chamber 136, and the actuator rod 132a and insertion tool 120 are in a "forward axial" position. In the forward axial position, the insertion tool 120 is sufficiently forward to allow the retractor 126 to engage the burn-in board 22 for unseating. It should be understood that although these positions and movements of the insertion tool are used with the preferred embodiment of the invention, the present invention is not limited to these positions or movements and can be constructed and configured to use any suitable positions and movements.

The drive mechanism 134 of the insertion tool actuator 130 as well as other component parts of the preferred embodiment are actuated by electronically (software) controlled solenoid valves (not shown) with the use of a pneumatic source (not shown) and source lines. However, other suitable control methods and components may instead be used.

In the preferred embodiment, the forward axial position of the insertion tool 120 is undesirable during seating of burn-in boards 22 because it can cause the application of excessive force on the electrical sockets (not shown) in the chamber 14 (FIG. 1) being engaged by the burn-in board 22 being seated. Thus, the insertion tool actuator 130 of the preferred embodiment is equipped with at least one sensor 138 (FIGS. 5c and 5e) for detecting when the piston 135 (and insertion tool 120) is in the intermediate axial position (FIG. 5e) and causing the drive mechanism to be prevented from moving the piston 135 and insertion tool 120 into the forward axial position.

Figure 6:
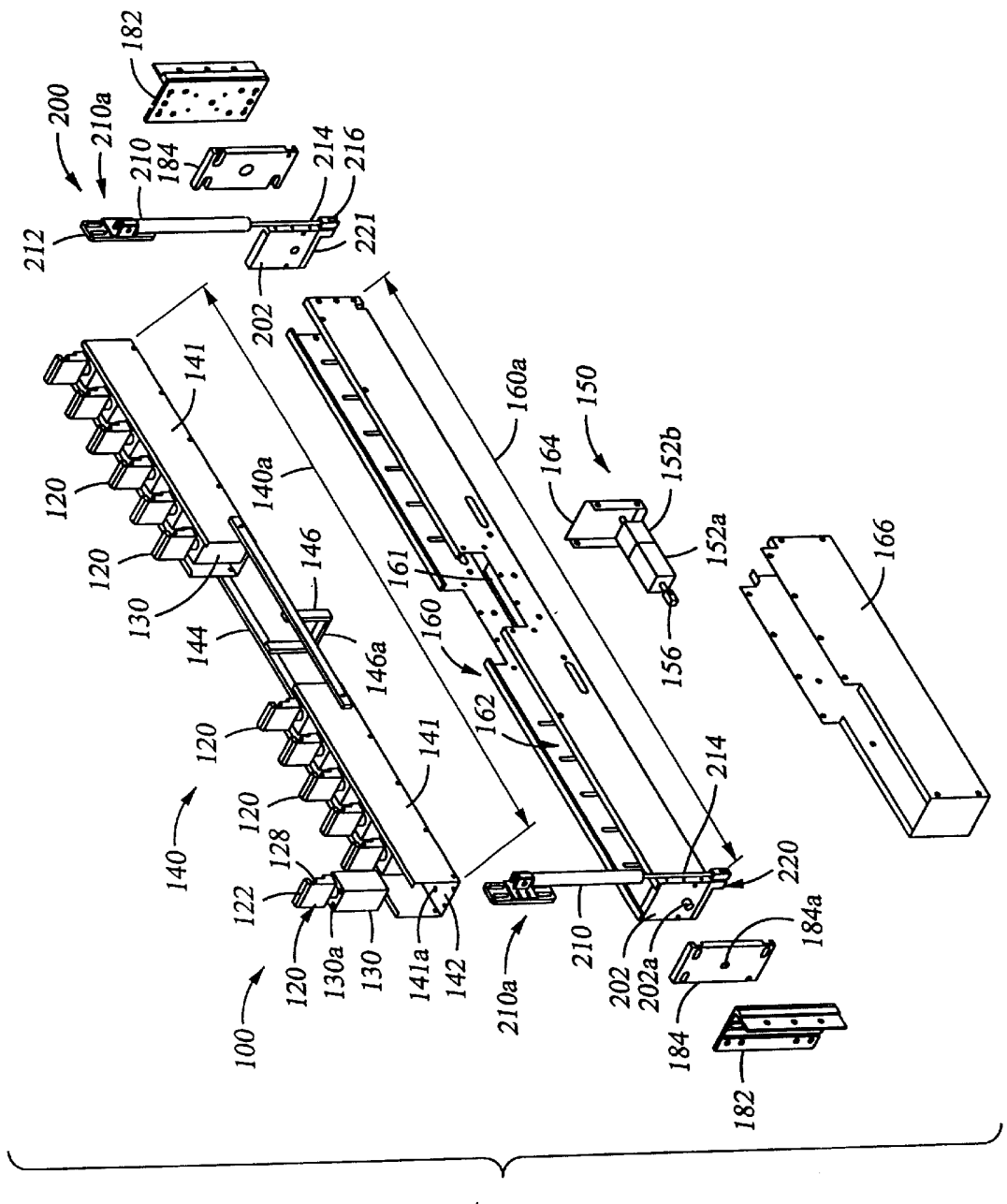
FIG. 6 is an exploded view of a preferred embodiment of a seating device made in accordance with the present invention.

As shown in FIG. 6, the preferred embodiment of the seating tool 100 includes twelve sets of insertion tools 120 and corresponding insertion tool actuators 130. However, any number of insertion tools 120 may be used in accordance with the present invention, as desired. Furthermore, while the preferred embodiment includes one insertion tool actuator 130 for each insertion tool 120, the present invention is not so limited; other combinations of insertion tools 120 and insertion tool actuators 130 may instead be used.

Still referring to FIG. 6, the insertion tool actuators 130 of the preferred embodiment are disposed in a carrier 140. The carrier 140 is a pair of structural channels 141 within which the insertion tool actuators 130 are carried in spaced relationship. In the illustrated configuration, each insertion tool actuator 130 is mounted to a structural channel 141 with four bolts (not shown) extending through holes 130a in the actuators 130 and holes 141a in the bottom 142 of the structural channel 141. However, other suitable conventional connectors for connecting the insertion tool actuator or actuators 130 with the carrier 140 may be used. The insertion tool actuators 130 of the preferred embodiment are spaced apart such that all twelve corresponding insertion tools 120 will be simultaneously alignable with either all of the odd or all of the even numbered boards 22 (FIG. 3) in the exemplary chamber 14. The structural channels 141 of the preferred embodiment are connected by a pair of aligned bars 144, such as with bolts or pins. The position of the bars 144 and thus the gap between the structural channels 141 may be adjustable, such as by having a series of anchor holes (not shown) in the channels 141 for connection with the bars 144. The bars 144 are connected together with a downwardly extending U-shaped bracket 146.

As shown in FIG. 4, the present invention also includes a translational movement mechanism 150 capable of selectively causing translation, or lateral movement, of the insertion tool actuators 130 and corresponding insertion tools 120 relative to the chamber 14. The insertion tool or tools 120 can thus be moved left and right across the front of the chamber 14 (FIG. 2) for positioning adjacent or between different boards 22 in the chamber 14. The term "translational movement mechanism" as used herein means a device or combination of components formed with any shape, configuration and operation capable of translating, or laterally moving, at least one insertion tool made in accordance with the present invention relative to a chamber, and is otherwise compatible for use with the present invention. Thus, the seating device 100 of the present invention could, in an embodiment (not shown), include a single insertion tool moveable across an entire chamber opening or openings for seating all boards in the chamber.

Figure 7A:
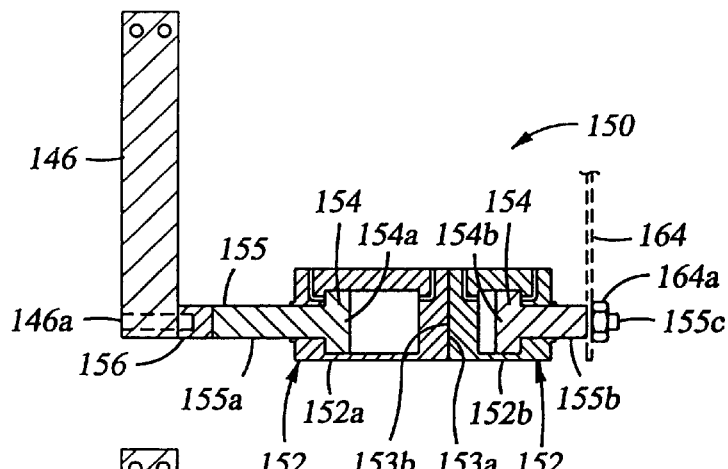
FIGS. 7a–d are cross-sectional views of a preferred embodiment of a translational movement mechanism made in accordance with the present invention.

Now referring to FIG. 7a, the translational movement mechanism 150 of the preferred embodiment includes a pair of back to back pneumatic cylinders 152, each including a pneumatically driven piston 154. These cylinders 152 may be any suitable conventional cylinders, such as SMC Part Number NCDQ2. The left and right cylinders 152a, 152b are connected together at their back ends 153a, 153b, such as by weld or any other suitable conventional technique. At their front ends 154a, 154b, a piston rod 155a, 155b, which extends from the pistons 154, passes outwardly from the cylinders 152a, 152b, respectively. The piston rods 155 are controllably reciprocated by selectively reciprocating the pistons 154, which may be accomplished similarly as described above with respect to the insertion tool actuator 130.

Figure 8:
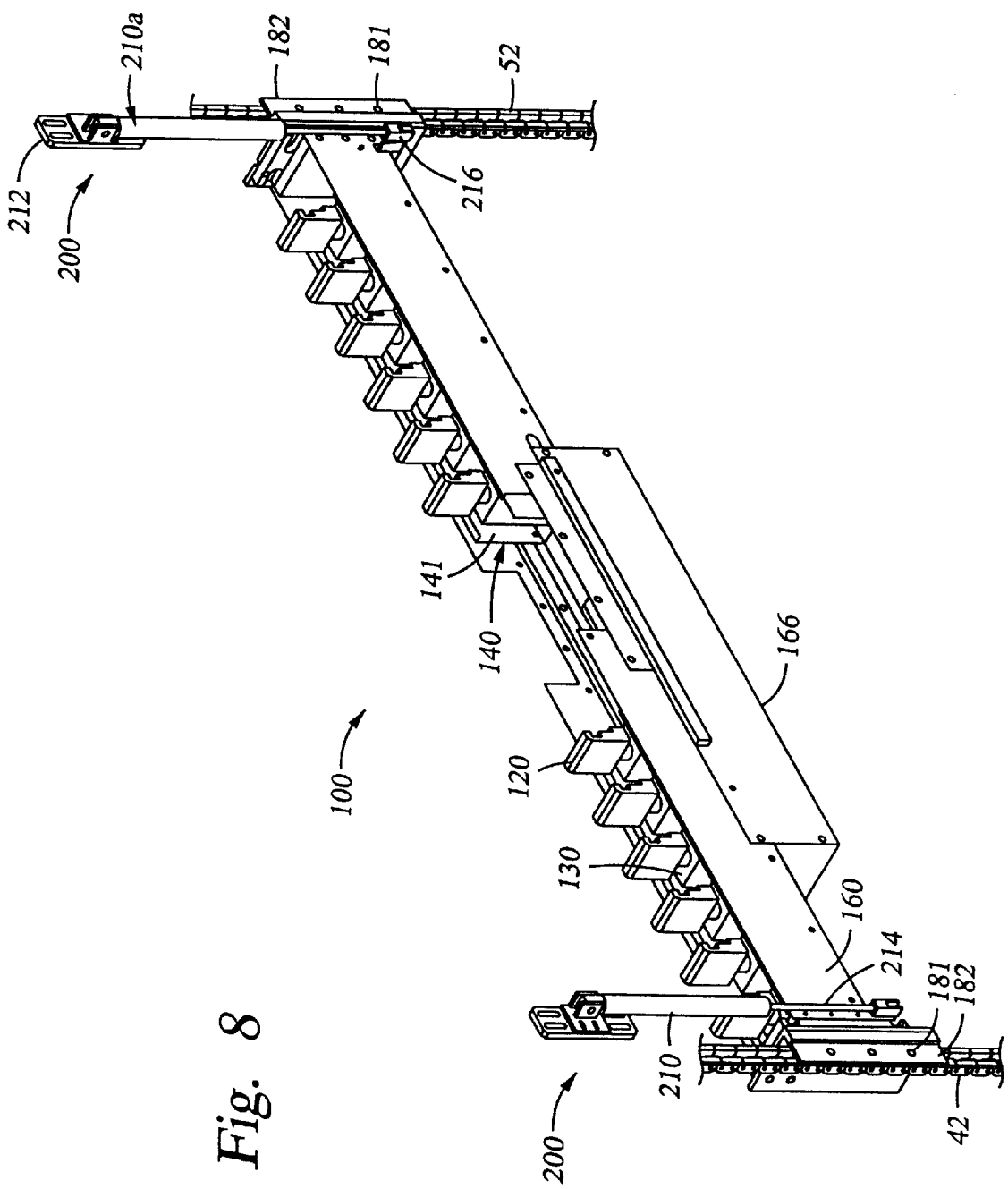
FIG. 8 is an isometric view showing a preferred embodiment of numerous insertion tools made in accordance with the present invention in an upright position.

Referring to FIGS. 6 and 8, the translational movement mechanism 150 of the preferred embodiment engages the carrier 140 (FIG. 4a), and causes the carrier 140 and insertion tools 120 to move as described above. To enable such movement, the carrier 140 of the preferred embodiment is disposed in a main housing 160 in a manner that allows sideways movement of the carrier 140 within the main housing 160. For example, the interior cavity 162 of the main housing 160 may be formed with a length 160a greater than the length 140a of the carrier 140, allowing the structural channels 141 to slide or freely move sideways within the main housing 160. The main housing 160 is disposed such that it generally cannot move sideways, as will be described further below. Further, the main housing 160 is structurally rigid sufficient to prevent its severe flexing or damage to the seating device 100. Other suitable configurations, however, may be used to allow sideways movement of the carrier 140 relative to the main housing 160. Additionally, the main housing 160 of the preferred embodiment includes a center gap 161 to allow passage of the U-shaped bracket 146 of the carrier 140 through the main housing 160 and sideways movement of the U-shaped bracket 146 relative to the main housing 160.

Now referring to FIGS. 7a–d, the piston rod 155b of the right cylinder 152b of the translational movement mechanism 150 of the preferred embodiment is anchored proximate to its end 155c to a plate, or end cap 164, such as by mating with a nut 164a. The end cap 164, like the main housing 160 (FIG. 8), is mounted so that it cannot move sideways. In the preferred embodiment, the end cap 164 is rigidly connected to a back cover 166 (FIGS. 6, 8) that is rigidly connected to the main housing 160. The back cover 166 may contain other components of the seating device 100, such as solenoid valves (not shown) connected with the insertion tool actuators 130, cylinders 152 and rotational cylinders 210 (FIG. 6), though such components may instead be disposed external to the seating device 100. These connections may be made with the use of screws, bolts, pins or other conventional connectors (not shown).

Figure 7B:
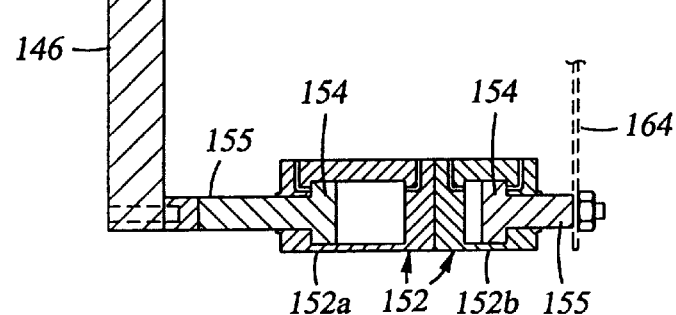
Figure 7C:
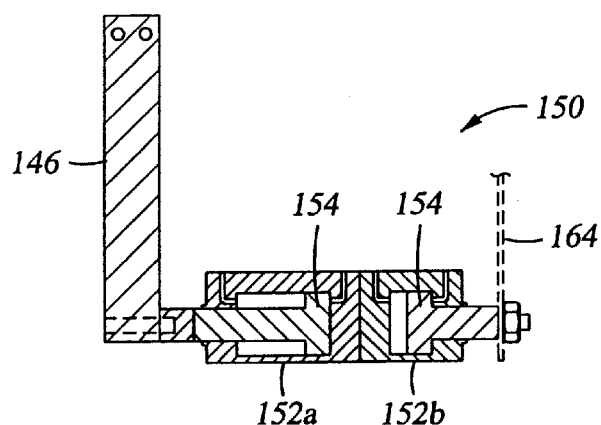

Still referring to FIGS. 7a–d, the piston rod 155a of the left cylinder 152a is connected, such as with a clevis 156, to the base 146a of the U-shaped bracket 146. The translational movement mechanism 150 of the preferred embodiment can be selectively actuated to provide four different positions for the carrier 140 (FIG. 6) and thus the insertion tools 120. The first position (FIG. 7a) is provided when the pistons 154 and piston rods 155 of both cylinders 152a, 152b are placed in extended positions (FIG. 7a), causing a far left, or "first translation" position of the U-shaped bracket 146 and thus the insertion tools 120. The second position, as shown in FIG. 7b, is provided when the piston 154 of the left cylinder 152a is placed in an extended position, while the piston 154 of the right cylinder 152b is placed in a retracted position. The resulting position of the insertion tools 120 is referred to herein as the "second translation" position. As shown in FIG. 7c, the third position is achieved when the piston 154 of the left cylinder 152a is placed in a retracted position, while the piston 154 of the right cylinder 152b is placed in an extended position, causing the "third translation" position of the insertion tools 120. Finally, the fourth position (FIG. 7d) is achieved when the pistons 154 and piston rods 155 of both cylinders 152a, 152b are placed in retracted position, causing a "fourth translation" position of the U-shaped bracket 146 and the insertion tools 120. As will be described below, movement of the insertion tools 120 of the preferred embodiment in and between these position will enable seating and unseating of all burn-in boards 22 (FIG. 3) in an entire row in the chamber 14.

Figure 16A:
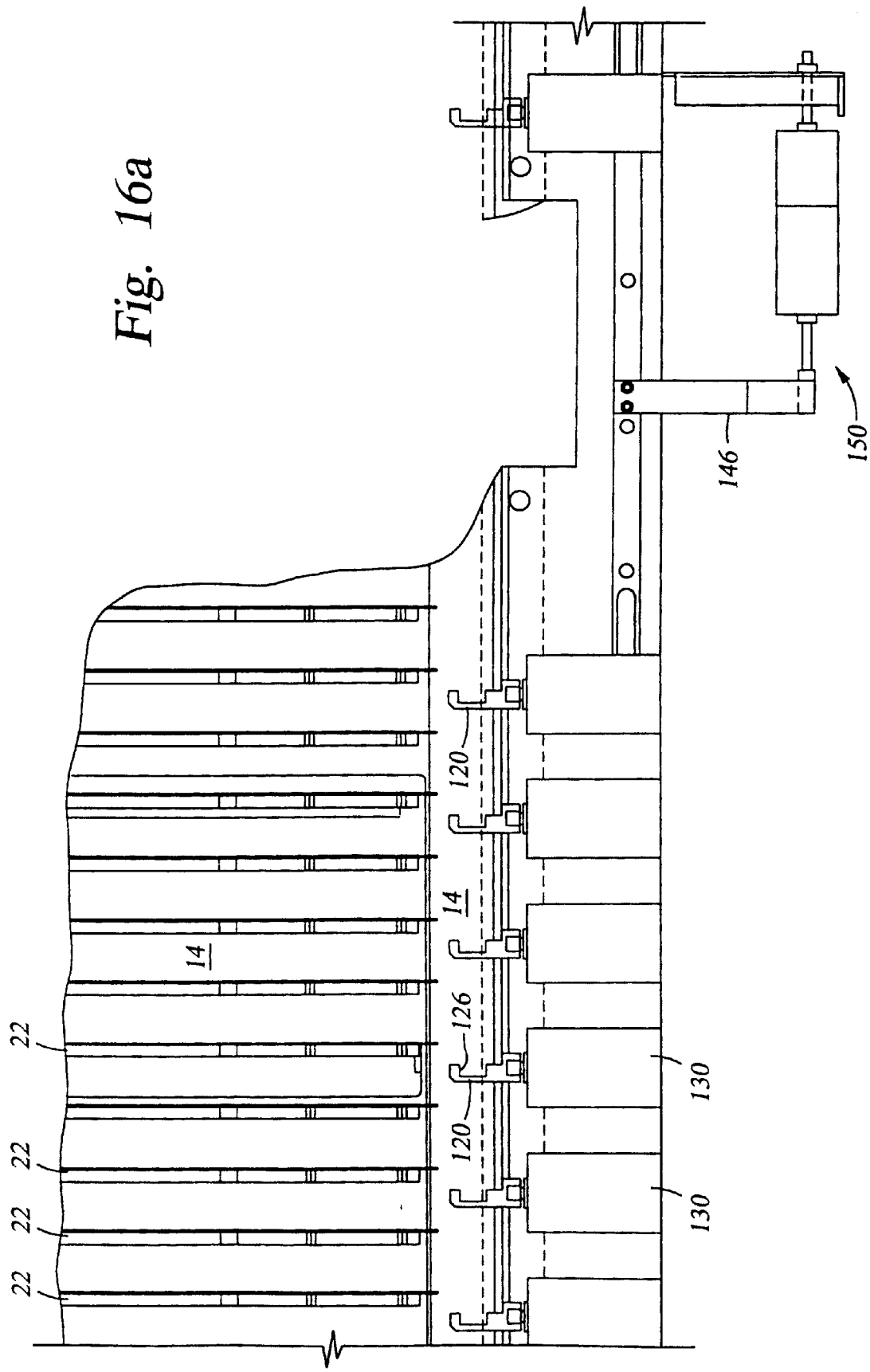
Figure 16C:
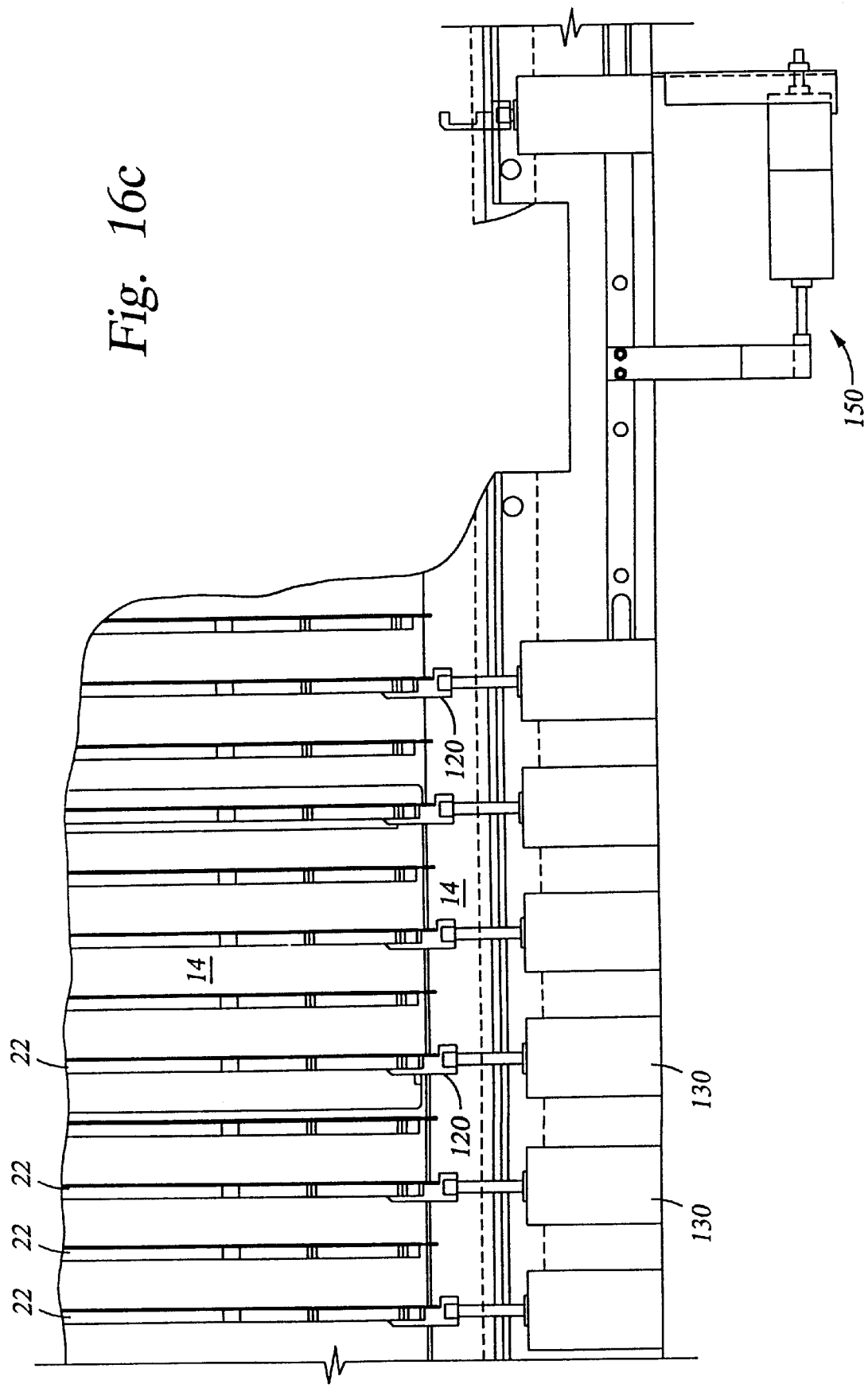
Figure 16D:
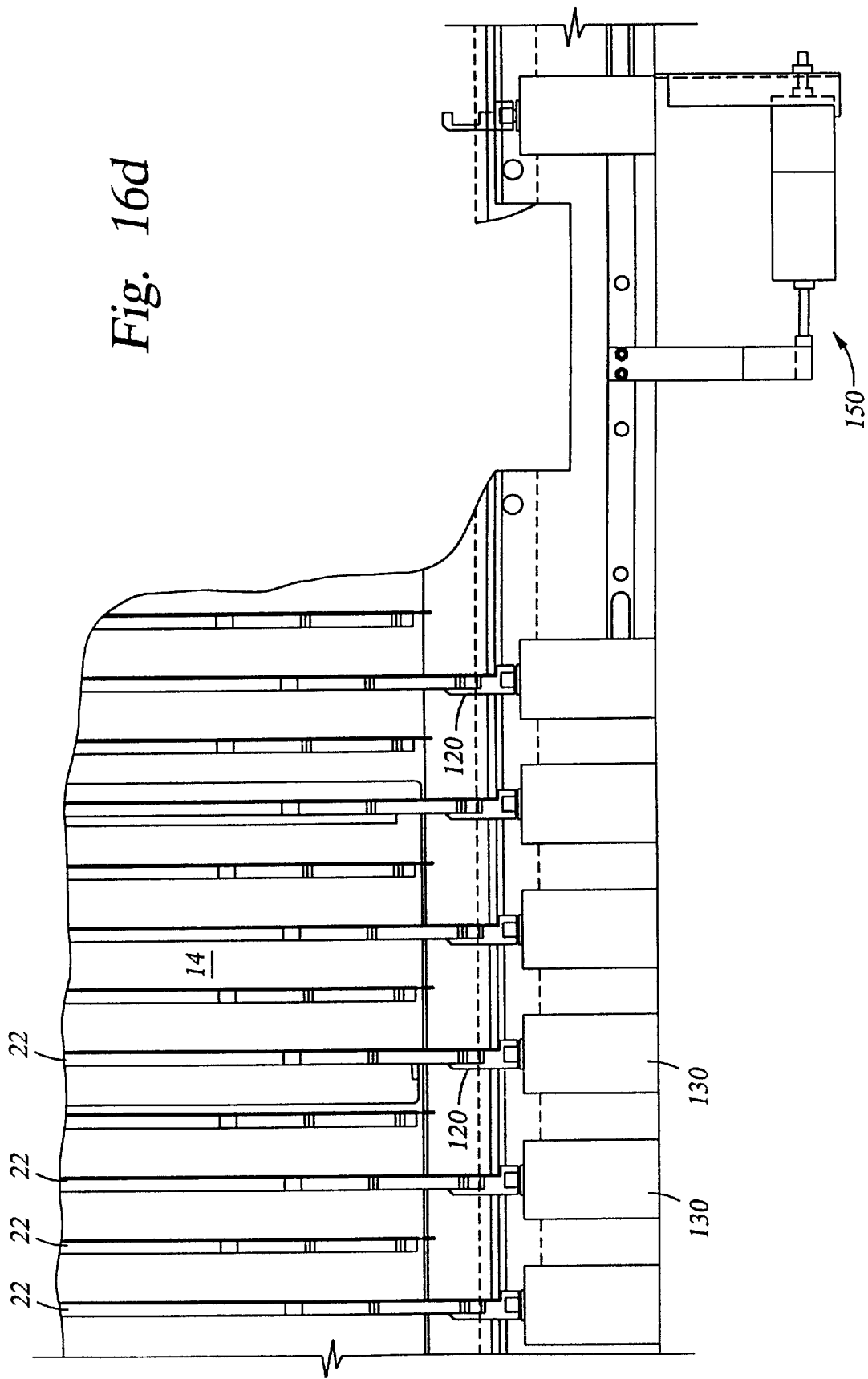
Figure 16E:
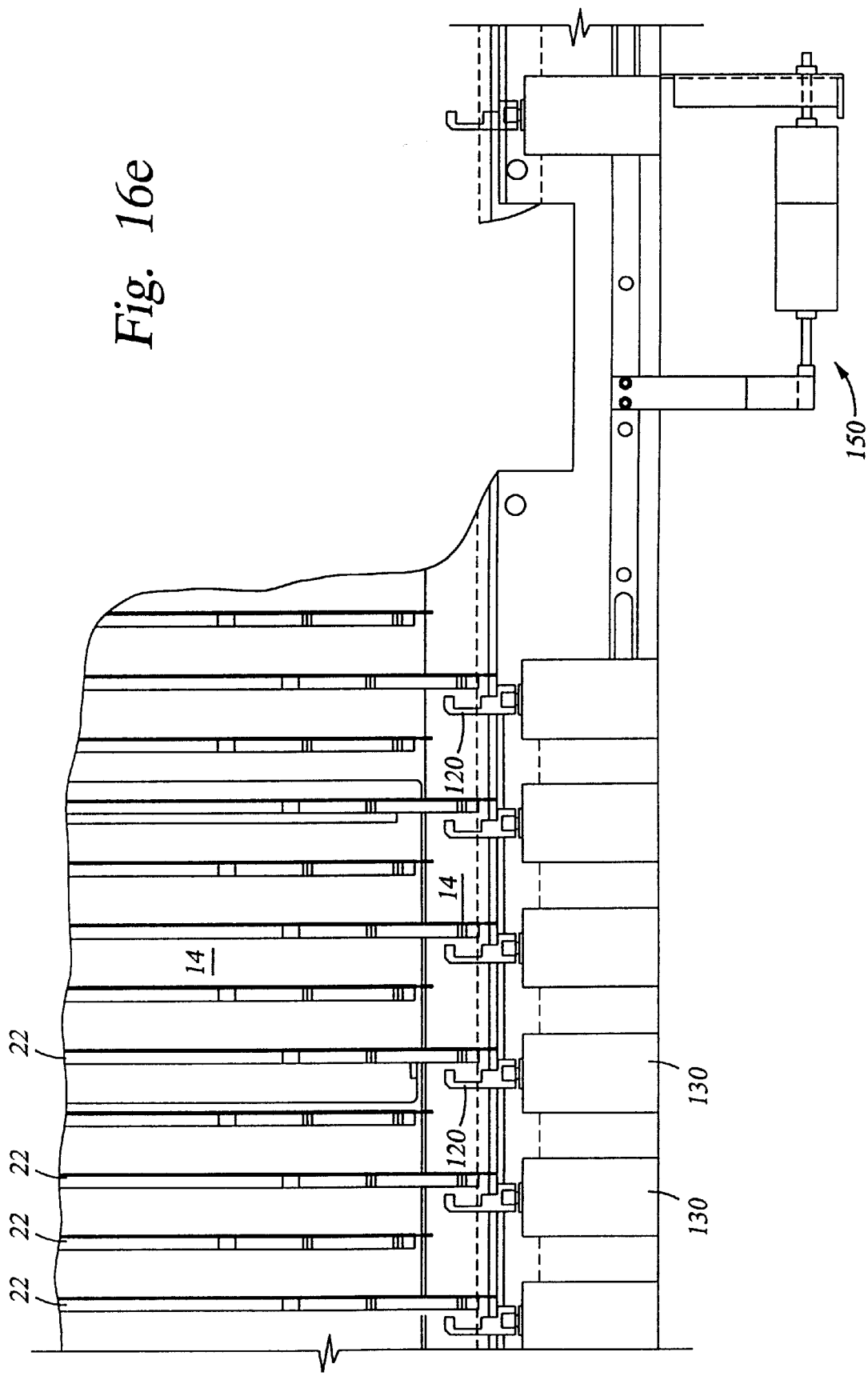

In the preferred embodiment, the piston rods 155 of the left and right cylinders 152a, 152b are of different lengths to correspond the translational movement of the insertion tools 120 with the spacing of the boards 22 in the chamber 14 (FIG. 3) to enable seating (and unseating) thereof. The left piston rod 155a has a fully extended length of approximately 1.5 inches, while the right piston rod 155b has a fully extended length of approximately 0.5 inches. In the first translation position (FIG. 7a), the insertion tools 120 may be positioned approximately 0.5 inches to the left of the odd numbered boards 22, enabling use of the insertion tools 120 for unseating, as shown in FIGS. 16a, 16b, 16e. The second translation position of the insertion tools 120 (FIG. 7b) enables engagement with the odd numbered boards 22 for seating (FIGS. 4a, 4b) and unseating (FIGS. 16c, 16d). The third translation position places the insertion tools 120 between the odd and even numbered boards 22, enabling use of the insertion tools 120 for unseating the even numbered boards 22, as shown in FIGS. 16f and 16g. Finally, the fourth translation position aligns the insertion tools 120 with the even numbered boards 22 for seating (FIGS. 4c, 4d) and unseating (FIGS. 16h, 16i).

The present invention also includes a vertical movement mechanism 180 (FIG. 3) enabling vertical movement of the insertion tools 120 for seating (and unseating) of burn-in boards 22 at different heights, or in all rows 112, 114, 116, in the chamber 14. The term "vertical movement mechanism" as used herein means a device or combination of components formed with any shape, configuration and operation capable of vertically moving an insertion tool or tools made in accordance with the present invention relative to the chamber, and is otherwise is compatible for use with the present invention. For example, the vertical movement mechanism may be a mobile insertion tool carrier (not shown) moveable, such as on wheels, into position adjacent the chamber opening(s) for seating (and unseating) of boards therein.

Figure 9:
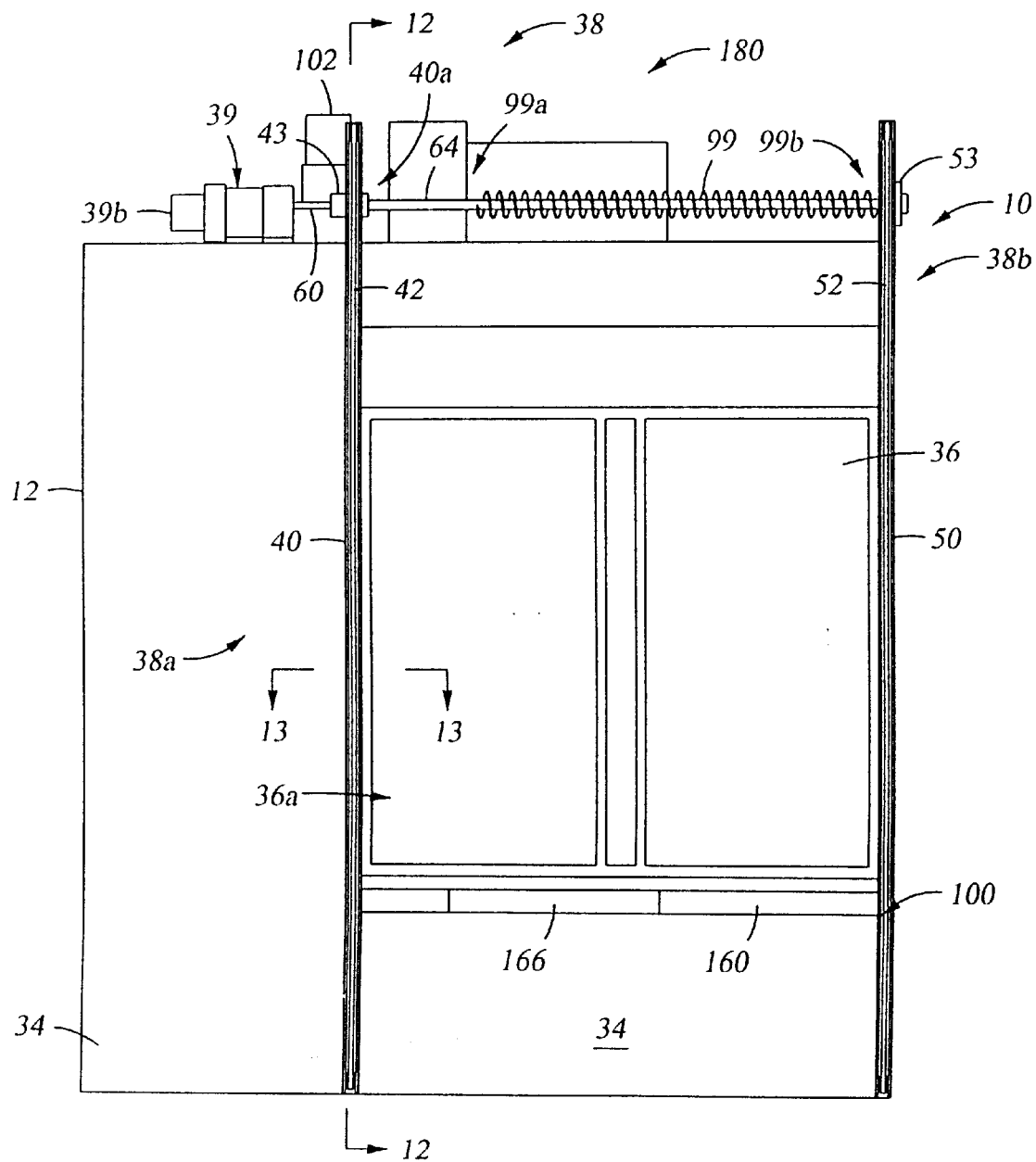
FIG. 9 is a front view of the device of FIG. 1 showing a covering actuator of the preferred embodiment of the vertical movement mechanism of the present invention.

In the preferred embodiment, the vertical movement mechanism 180 includes a chamber covering actuator 38, as disclosed in U.S. Pat. No. 6,017,215, which, as stated above, is incorporated herein by reference in its entirety. As used herein, the term "covering actuator" means any device capable of enabling the movement of insertion tools made in accordance with the present invention vertically relative to a chamber opening, and that is otherwise compatible for use with the present invention. Referring specifically to FIG. 9, the preferred covering actuator 38 includes a motor 39, left and right rails 40, 50, left and right chains 42, 52, and various chain guides, such as sprockets 43, 44, 45, 46 and 48 (FIG. 11), as will be described further below. The chains 42, 52 may be any among a variety of suitable commercially available chains, such as ⅜ pitch roller chain. The various chain guides may be selected from among a variety of commercially available sprockets suitable for carrying the chains 42, 52 and otherwise compatible for use with the present invention. The rails 40, 50 of the preferred embodiment may be any among a variety of commercially available rails, or extrusions, that are suitable for use with the present invention, such as the aluminum conveyor extension Model No. 14-150 sold by ITEM.

Figure 10:
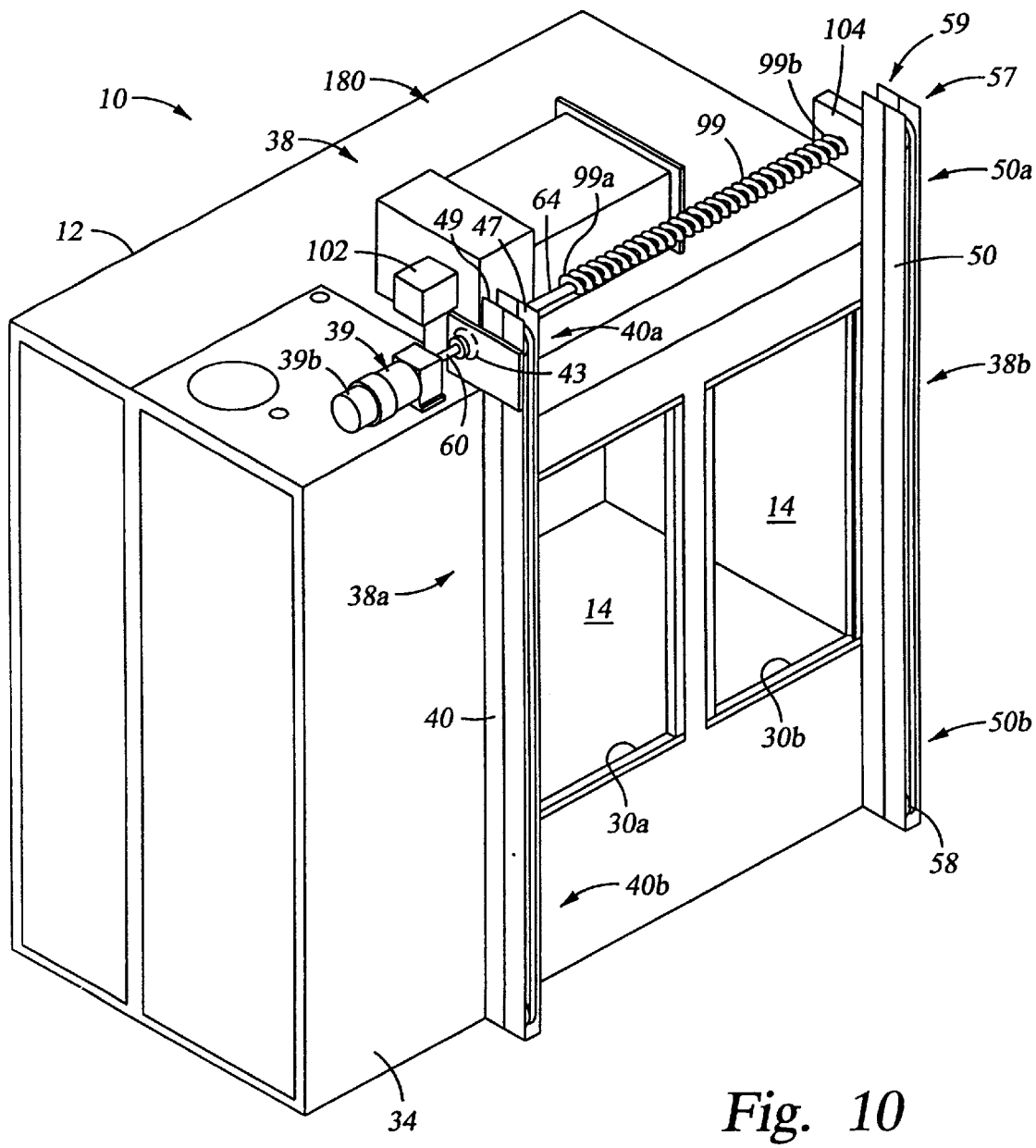
FIG. 10 is an isometric view of the device of FIG. 9 having the chamber opening covering removed.

As shown in FIGS. 9 and 10, the left rail 40 is preferably mounted on the front wall 34 of the housing 12 adjacent to the left side of the left opening 30a to the chamber 14, while the right rail 50 is mounted adjacent to the right side of the right opening 30b to chamber 14. The motor 39 of the preferred embodiment of the covering actuator 38 includes a gearbox 39a and a brake mechanism 39b, and may be any conventional standard electric motor suitable for use with the present invention. Although the motor 39 is shown mounted on the housing 12 proximate to the upper end 40a of the left rail 40, it may be disposed at any other suitable location within or upon the device 10. The motor 39 rotatably drives a shaft 60 extending laterally from the motor 39 to a left drive sprocket 43 mounted to the device 10 behind the left rail 40. A second shaft 64 extends laterally from the left drive sprocket 43 to a corresponding right drive sprocket 53 similarly disposed with respect to the right rail 50. Selective actuation of the motor 39 causes the shafts 60, 64 and the sprockets 43, 53 to rotate, opening and closing the covering 36 and moving the seating device 100 (FIG. 3) into and out of various vertical positions for seating burn-in boards, as will be described further below.

Figure 11:
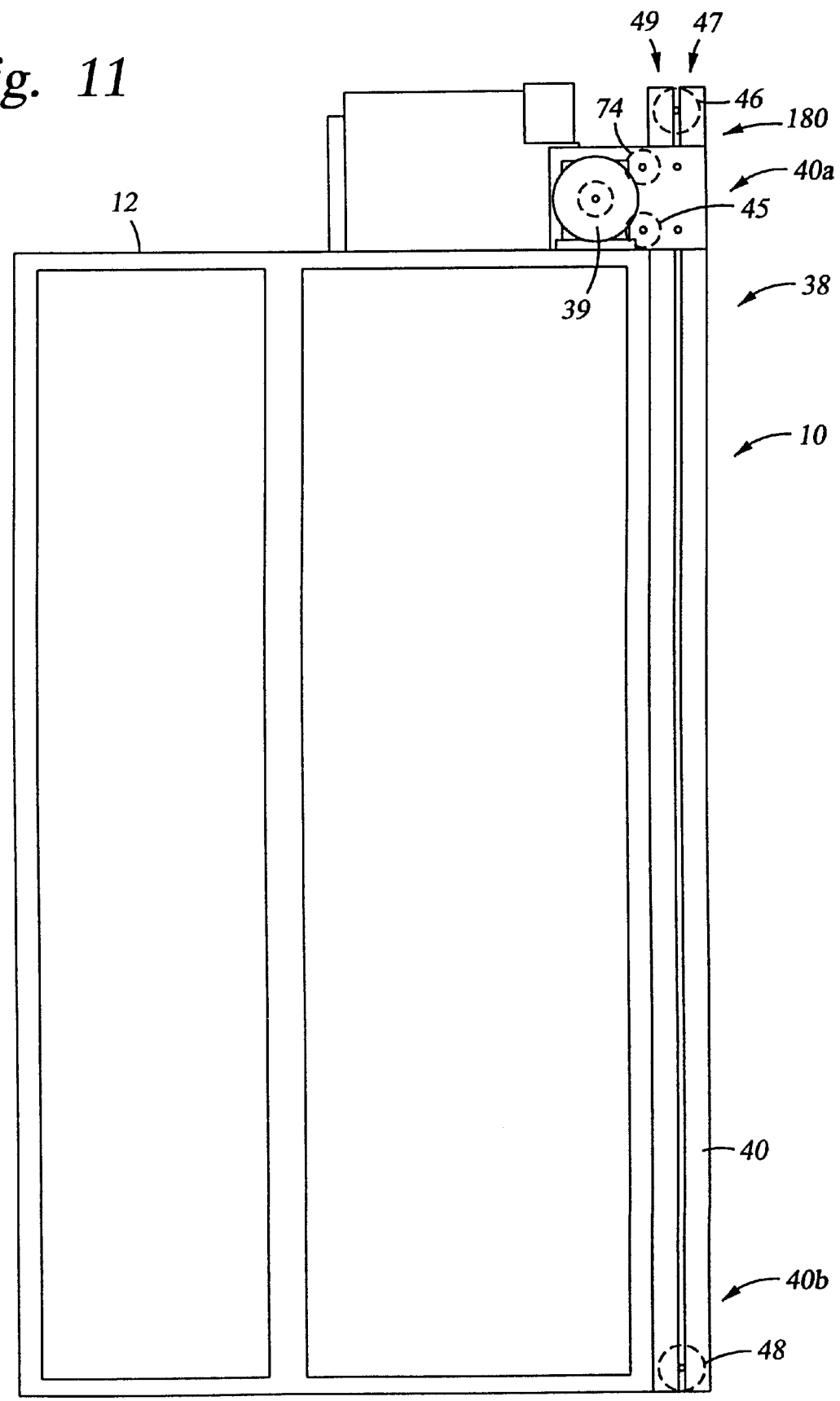
FIG. 11 is a left side view of the device of FIG. 10.
Figure 12:
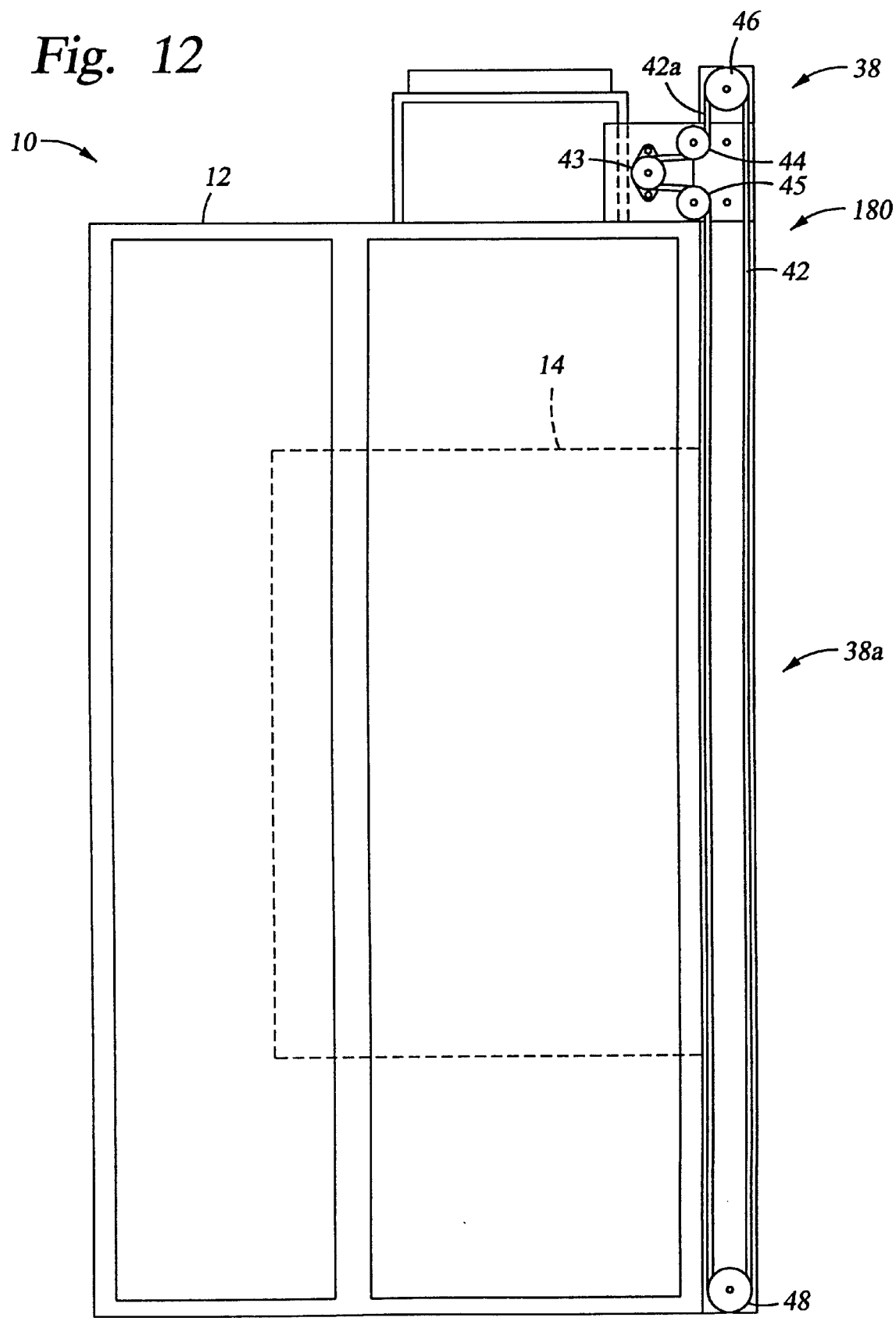
FIG. 12 is a cross-sectional view of the device of FIG. 9 taken along lines 12—12 showing the left chain without the left rail of a covering actuator of a vertical movement mechanism made in accordance with the present invention.

The left side 38a of the preferred embodiment of the covering actuator 38 is shown in FIGS. 11 and 12. The left chain 42 passes around the left drive sprocket 43 (FIG. 12) and is directed upwardly therefrom at one end as it extends around a first left middle sprocket 44, and downwardly therefrom at the other end as it extends around a second left middle sprocket 45. The upper end 42a of the chain 42 then loops over an upper left sprocket 46, which is mounted within the upper end 40a of the rail 40. From the upper left sprocket 46, the chain 42 extends downwardly through the length of a front passageway 47 of the rail 40. At the lower end 40b of the rail 40, the chain 42 loops around a lower left sprocket 48 mounted therein, and is then directed up a rear passageway 49 of the rail 40 to the sprocket 45. The configuration, operation and components of the right side 38b (FIGS. 9, 10) of the covering actuator 38, which includes the right rail 50 and chain 52, and corresponding right drive sprocket, first and second right middle, upper right and lower right sprockets (not shown), are similar to that of the left side 38a of the covering actuator 38.

Figure 13:
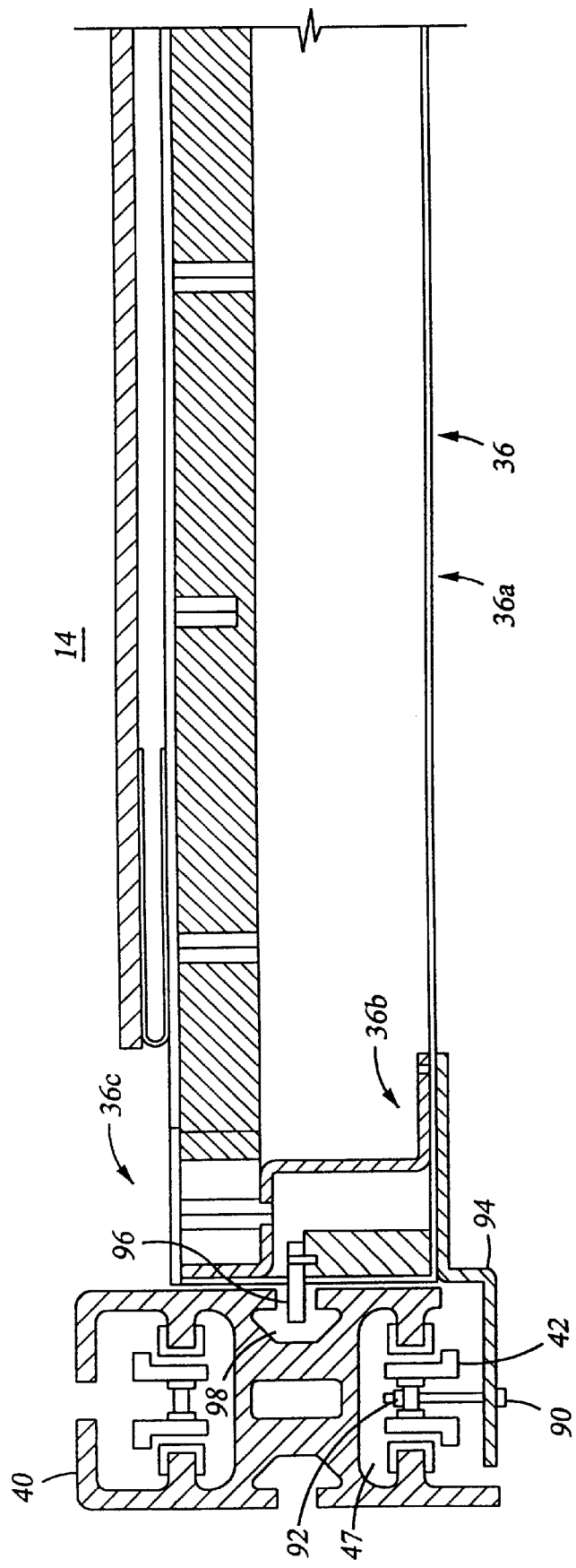
FIG. 13 is a partial cross-sectional view of the device of FIG. 9 taken along lines 13—13.

In FIG. 13, the left side of the chamber opening covering 36 is shown connected to the left chain 42 to enable movement of the covering 36 between open and closed position. The covering 36 is connected to the left chain 42 along a lower portion 36a of the covering 36 with any among a variety of commercially available connectors suitable for use with the invention, such as bolts 90 and nuts 92. The bolts 90 connect a lip, or faceplate, 94 extending from the left front edge 36b of the covering 36 across the front of the left rail 40 to a portion of chain 42 disposed in the front passageway 47 of the rail 40. The covering 36 is similarly connected (not shown) with the right chain 52 (FIG. 9). Thus, as the chains 42, 52 are driven up and down through the left rail passageway 47 (FIG. 13) and the right rail passageway 57 (FIG. 10), respectively, by selective actuation of the motor 39, the covering 36 moves upwardly and downwardly therewith.

The seating device 100 of the preferred embodiment of the present invention (FIG. 3) is generally similarly connected to the covering actuator 38 as described above, and spaced below the covering 36. Specifically, as shown in FIG. 8, the left and right chains 42, 52 of the covering actuator 38 are connected, such as with bolts 181, to left and right chain attachment plates 182. The chain attachment plates 182 each rigidly connect with a mounting plate 184 (FIG. 6). Each mounting plate 184 of the preferred embodiment has a hole 184a that mates with a shaft, or pin, 202a extending from an end plate 202 of the main housing 160. Thus, as the chains 42, 52 are driven up and down through the left rail passageway 47 (FIG. 13) and the right rail passageway 57 (FIG. 10), respectively, by selective actuation of the motor 39, the main housing 160 and insertion tools 120 move upwardly and downwardly therewith. Further, the main housing 160 of the preferred embodiment and chamber opening covering 36 (FIG. 6) are generally movable upwardly and downwardly in unison relative to the chamber openings 30.

Referring to FIG. 9, a switch mechanism 102 may be used to enable selective actuation of the motor 39 of the preferred embodiment of the vertical movement mechanism 180 for movement of the insertion tools 120 (FIG. 3) between various vertical positions. The switch mechanism 102 monitors the movement of the covering 36 between numerous open positions of the covering 35 relative to the openings 30 and preferably communicates with a computer (not shown) programmed to turn on and off the motor 39. Any commercially available switch mechanism compatible for use with the present invention may be used. Furthermore, the motor brake 39b, which may be any conventional brake mechanism suitable for use with the motor 39 and other components of the present invention, may be configured to engage at each open position of the covering 36, providing safety from human injury or equipment damage due to downward slippage or movement of the covering 36 and main housing 160.

Figures 14A, 14B, 14C, 14D, 14E:
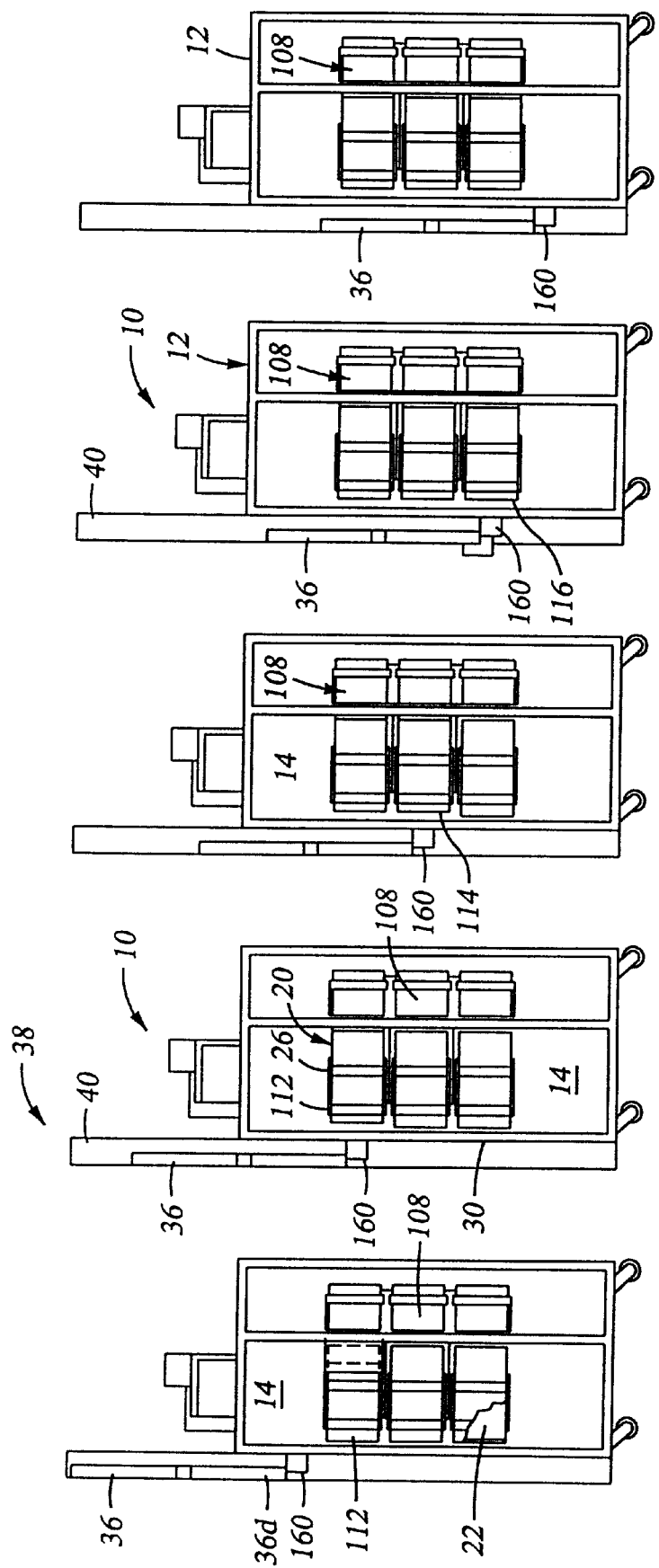
FIGS. 14a–e are right side views of the device of FIG. 3, each showing the interior of the chamber and a different position of a seating device made in accordance with the present invention and the chamber opening covering.

In the preferred embodiment of the vertical movement mechanism 180, the main housing 160 is positioned vertically below the chamber opening covering 36 (FIG. 3) such that when the covering 36 is moved into certain predetermined open positions, the insertion tools 120 are positioned adjacent one of the rows 112, 114, 116 of burn-in boards 22 for seating (or unseating). Referring to FIGS. 14a–e, for example, the covering actuator 38 (FIG. 9) may allow for a total of five different positions of the insertion tools 120. FIG. 14a illustrates an "upper vertical position" of covering 36 and main housing 160, whereby all boards 22 in the chamber 14 are accessible through the opening 30. In this position, the main housing 160 is located above the top row 112 of boards 22 and is thus not in a position for seating (or unseating) any boards 22. FIG. 14b shows the covering 36 main housing 160 lowered to a "first intermediate vertical position," whereby the insertion tools (not shown) carried by the main housing 160 are positioned for seating (and unseating) of the top row 112 of boards 22. FIGS. 14c and 14d show a "second intermediate vertical position" and "third intermediate vertical position" of the covering 36 and main housing 160, respectively, whereby the insertion tools (not shown) in the main housing 160 are positioned for seating burn-in boards 22 located in the middle and lower rows 114, 116, respectively. Finally, FIG. 14e illustrates a "lower vertical position" of the covering 36 and main housing 160, wherein the covering 36 is in a closed position over the chamber 14 and the main housing 160 is in a lowermost position.

It should be understood that the vertical movement mechanism 180, and its various component parts, such as the covering actuator 38 described above, may take other forms and have different elements and operation to enable movement of insertion tools made in accordance with the present invention between various vertical positions.

The seating device 100 of the present invention may include additional features to enhance effective, safe and easy seating and unseating of boards in a chamber. These additional features, however, are not essential for operation of the present invention. For example, one or more conventional infra-red light or movement sensors (not shown) may be attached to the device 10 for triggering engagement of the brake mechanism 39b (FIG. 9) or the switch mechanism 102, such as upon entry of an object into opening 30 when the main housing 160 is not in a lowermost position. For another example, referring again to FIGS. 9 and 10, a conventional counterbalance spring 99 may be disposed about the shaft 64 for bearing a portion of the weight of the covering 36 and seating device 100. The spring 99 is preferably connected at one end 99a to the shaft 64, and at the other end 99b to the device 10, such as to a plate, or bracket, 104 (FIG. 10). Because the covering 36 and seating device 100 may be of substantial weight, the operation of the counterbalance spring 99 will reduce the operating load imparted by such weight on the component parts of the covering actuator 38, such as the motor 39 and chains 42, 52; may enable manual vertical movement of the covering 36 and seating device 100, if desired; and will enhance safety during use.

The preferred embodiment of the seating device 100 of the present invention also includes an insertion tool rotation mechanism 200 (FIG. 3) capable of moving the insertion tools 120 between a first position for seating (and unseating) burn-in boards 22, and a second position for movement between positions and during non-use. As used herein, the term "rotation mechanism" is defined as a device or combination of components formed with any shape, configuration and operation capable of moving at least one insertion tool made in accordance with the present invention between a first position for seating (and unseating) of boards disposed in a chamber, and a second position useful for movement of the insertion tool between various positions and during non-use, and is otherwise compatible for use with the present invention. Furthermore, it should be understood that a seating device may be made in accordance with the present invention not including a rotation mechanism.

Figure 15:
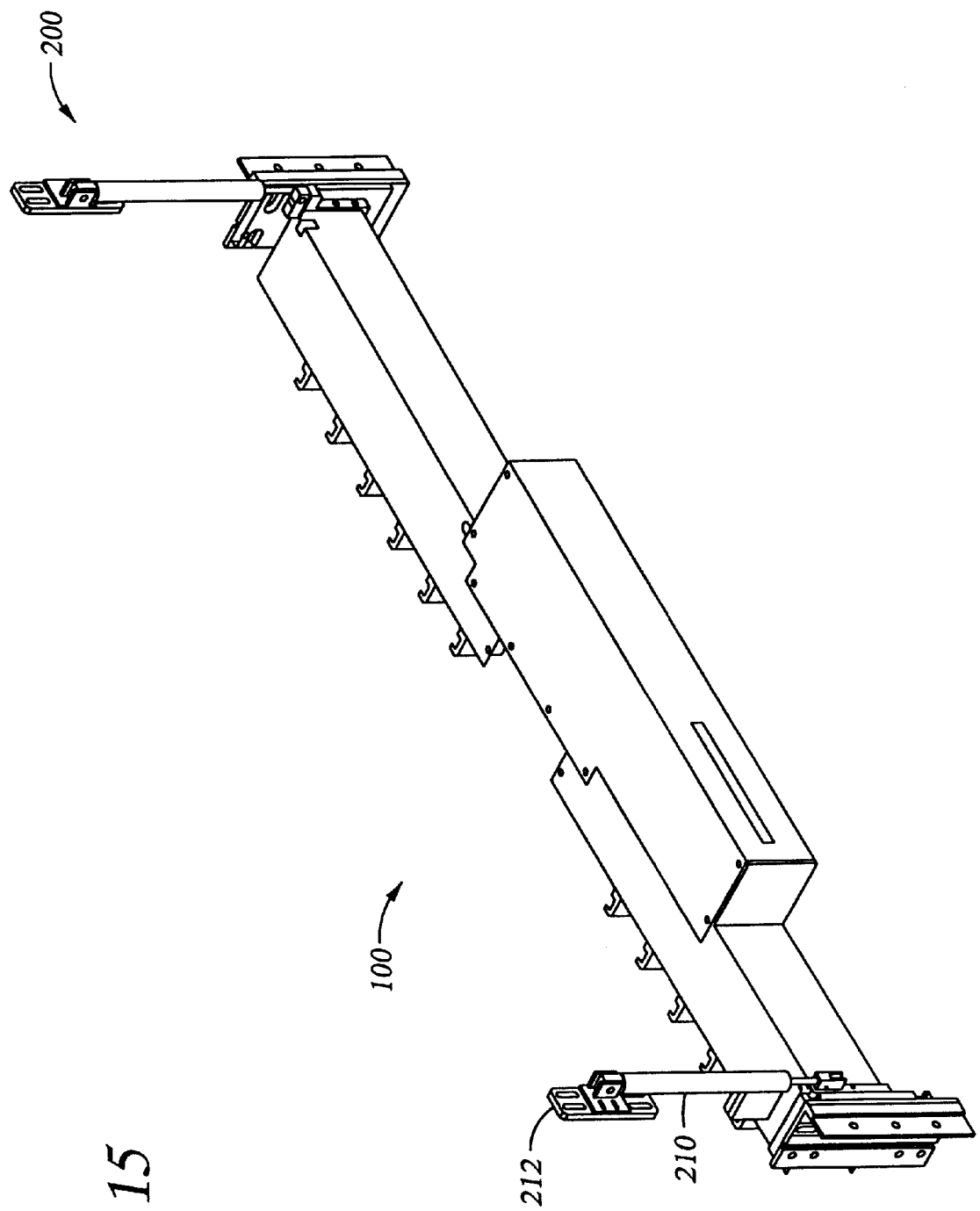
FIG. 15 shows the device of FIG. 8 having the insertion tools in a horizontal position.

As shown in FIG. 8, the first position is preferably an "upright" position of the insertion tools 120, where the insertion tools 120 point generally upwardly. As shown in FIG. 15, the second position is preferably a "horizontal" position of the insertion tools 120, whereby the insertion tools 120 point generally in the direction of the boards 22 disposed within chamber 14 (FIG. 3). In the horizontal position, the insertion tools 120 extend into the chamber openings 30 (FIG. 4a). In the upright position (FIG. 3), no part of the preferred embodiment of the seating device 100 extends into the chamber openings 30, allowing generally unobstructed movement of the main housing 160. The horizontal position is thus useful for seating (and unseating) of boards 22 with the preferred embodiment of the present invention, while the upright position is thus useful for movement of the insertion tools 120 between various positions.

Figure 17A:
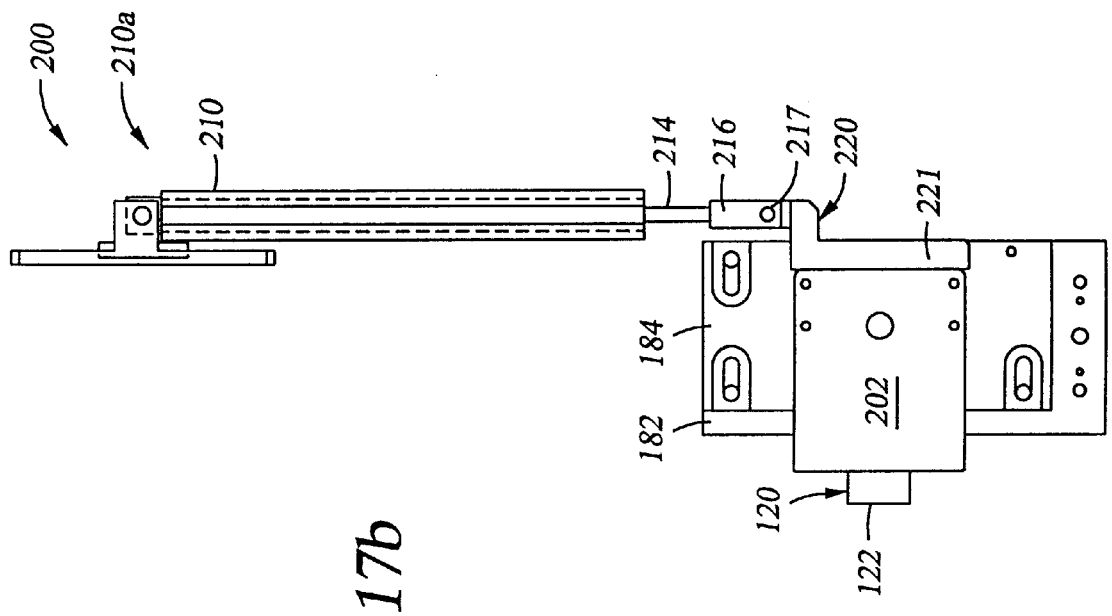
FIGS. 17a–b are side views of a preferred embodiment of the left side of a rotation mechanism made in accordance with the present invention.
Figure 17B:
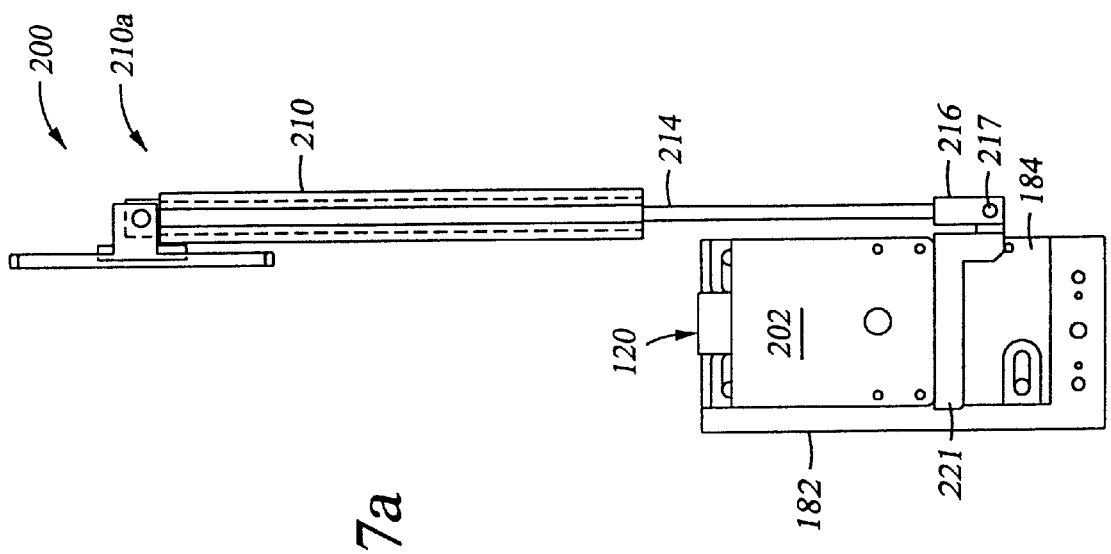

Referring FIGS. 6 and 17a–b, the rotation mechanism 200 of the preferred embodiment includes left and right rotational cylinders 210. The upper ends 210a of the rotational cylinders 210 are mounted, such as with a mounting plate 212 and screws (not shown) or other conventional connectors, to the chamber covering 36 (FIG. 3). The covering 36 preferably provides resistance and stability to the rotation mechanism 200 to allow effective rotation of the main housing 160 and insertion tools 210, as will be described below.

The reciprocating rod 214 of each rotational cylinder 210 extends downwardly therefrom. A connector, such as a clevis, 216 extends downwardly from each reciprocating rod 214 and engages a rotation arm 220. The rotation arm 220 is attached to the connector, or clevis, 216 such that it is pivotable about a pivot point, such as with the use of a pin 217, relative to the reciprocating rod 214. An elongated portion 221 of the each rotation arm 220 is rigidly connected to the end plate 202, each end plate 202 being mounted to the main housing 160. The shaft, such as a 0.5 inch pin 202a, which extends outwardly from each end plate 202, mates with, and is freely rotatable within, the hole 184a and bearings (not shown) in the mounting plate 184. Each mounting plate 184, being attached to a chain attachment plate 182, is not rotatable. Thus, the interface of the shaft or pin 202a and mounting plate 184 form an axis of rotation of the main housing 160 relative to the device 10 (FIG. 3).

The rotational cylinders 210 of the preferred embodiment may be any suitable conventional cylinder, such as the pneumatically actuated cylinder Model Number 043-AP sold by BIMBA. The rotational cylinders 210 may be controlled with circuitry and solenoid switches, or otherwise, similarly as described above with respect to the insertion tool actuator drive mechanisms 134. When the rotational cylinders 210 of the preferred embodiment are in their fully retracted position, the rotation arms 220 extends vertically downwardly, as shown in FIGS. 15 and 17b. In this position, the insertion tools 120 are in the horizontal position as described above. Actuation of the rotational cylinders 210 from the retracted position to their extended positions causes the rotation arms 220, end plates 202 and main housing 160 to rotate approximately 90 degrees, moving the insertion tools 120 from the horizontal to the upright position. The rotation mechanism 200 of the preferred embodiment thus rotates the insertion tools 120 generally within a 90-degree range.

A method for seating PC and burn-in boards with a seating device made in accordance with the present invention will now be described. With the use of the preferred embodiment of the seating device 100 and burn-in device 10, as shown in FIG. 3, the boards 22 must be disposed a sufficient distance within the chamber 14, such as approximately ⅜" from the corresponding electrical sockets 108 (FIG. 14a) in the chamber 14, to allow unobstructed movement of the insertion tools 120 into position. Assuming the chamber 14 has a fall capacity of boards 22 to be seated, the main housing 160 of the seating device 100 and insertion tools 120 are moved into the first intermediate vertical position (FIG. 14b) for seating the upper row 112 of boards 22.

Referring to FIG. 4a, the cylinders 152 of the translational movement mechanism 150 are actuated to move the insertion tools 120 into their second translation positions (FIG. 7b). The rotation mechanism 200 is actuated as described above to move the insertion tools 120 from the upright position (FIG. 8) to the horizontal position (FIG. 15). The engagement surface 122 of each insertion tool 120 is thus aligned with the side 22a of each successive odd numbered burn-in board 22. The insertion tool actuators 130 are then actuated to move the insertion tools 120 into their intermediate axial positions, as described above with respect to FIG. 5f and as shown in FIG. 4b, causing the insertion tools 120 to push the odd numbered boards 22 into engagement with the electrical sockets (not shown) in the chamber 14, thus seating the boards 22. Generally, with the preferred embodiment, the insertion tool actuators 130 are preferably actuated individually from left to right for successively seating (or unseating) the boards 22 to limit the amount of forces exerted on the boards 22 and the seating device 100. It should be understood, however, that the present invention does not require sequencing the seating or unseating of boards 22 in this manner; depending on the configuration of the seating device 100, the boards 22 may be seated and unseated in any suitable sequences, as desired. The insertion tool actuators 130 are then retracted, moving the insertion tools 120 into their retracted axial position (FIG. 5a), disengaging the insertion tools 120 from the boards 22. The rotation mechanism 200 can then be actuated to move the main housing 160 and insertion tools 120 into the upright position (FIG. 8).

Figure 4C:
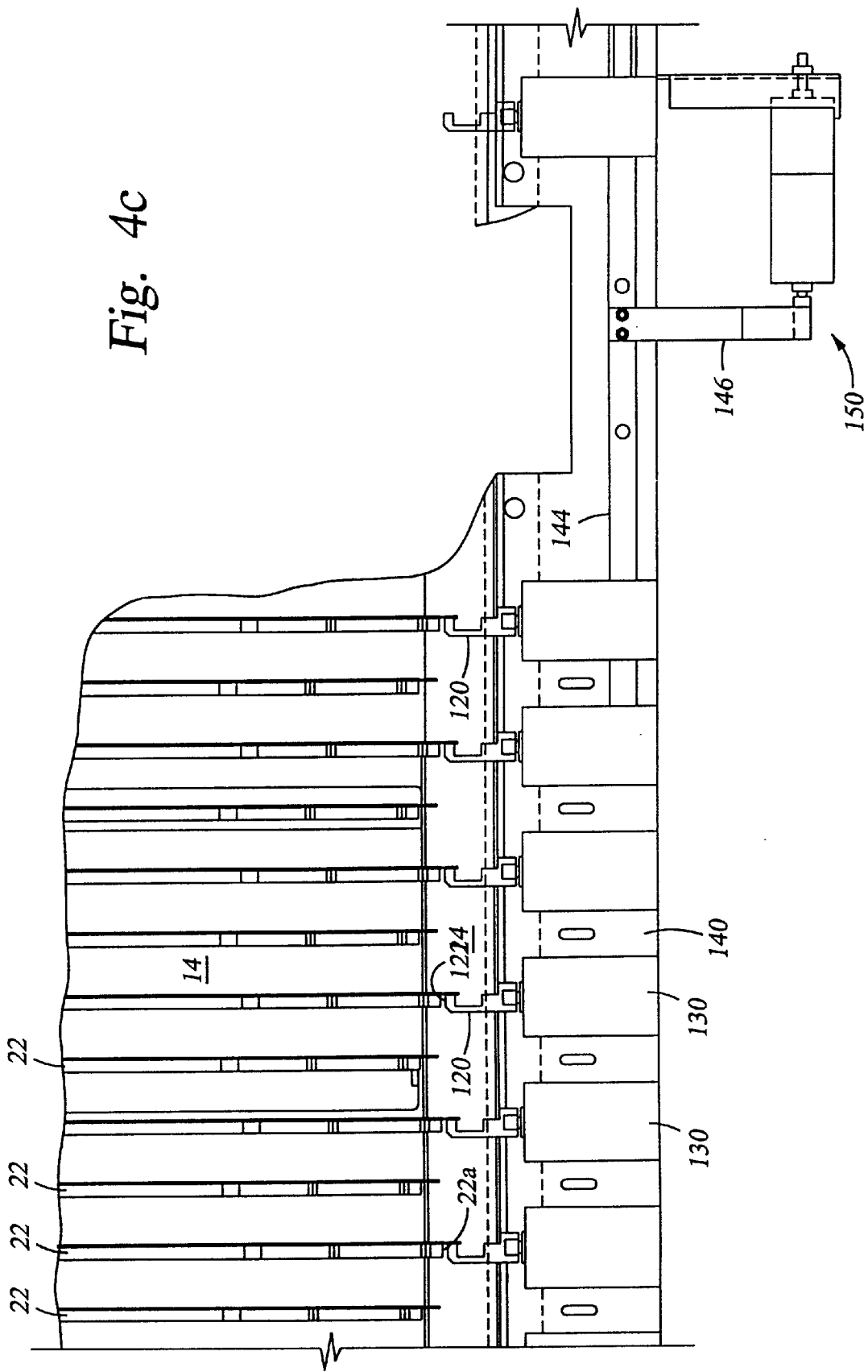

Referring to FIG. 4c, to reposition the insertion tools 120 of the preferred embodiment for seating the even numbered boards 22 on the same row as above, the translational movement mechanism 150 is actuated to move the insertion tools 120 into the fourth translation position, as described above with respect to FIG. 7d. Actuation again of the rotation mechanism 200 to move the insertion tools 120 into the horizontal position (FIG. 15) aligns the insertion tools 120 with the even numbered boards 22. Similarly as described above, the insertion tool actuators 130 are then actuated to move the insertion tools 120 into their intermediate axial positions (FIG. 4d). The insertion tool actuators 130 are then retracted, moving the insertion tools 120 into their retracted axial position (FIG. 5a), disengaging the insertion tools 120 from the boards 22. The rotation mechanism 200 can then be actuated to move the main housing 160 and insertion tools 120 into the upright position (FIG. 8). The vertical movement mechanism 180 (FIG. 9) may then be actuated to move the insertion tools 120 into the second intermediate vertical position adjacent with the middle row 114 of boards 22 (FIG. 14c), and the above sequence of steps repeated for seating the middle row 114 of boards 22. Thereafter, the vertical movement mechanism 180 may be actuated to move the insertion tools 120 into the third intermediate vertical position for seating the lower row 116 of boards 22 (FIG. 14d) and the above seating sequence steps again repeated.

A method for unseating boards 22 with the seating device 100 of the preferred embodiment will now be described. It should be understood, however, that the capability for unseating is not essential for practice of the present invention. Unseating requires that the boards 22 be fully seated in the chamber 14. Again, assuming the chamber 14 has a full load of seated boards 22, the vertical movement mechanism 180 is actuated similarly as described above in connection with seating. The translational movement mechanism 150 is actuated to move the insertion tools 120 into their first translation position, as shown in FIGS. 7a, 16a. The rotation mechanism 200 is then actuated to move the insertion tools 120 into the horizontal position (FIG. 15); the insertion tool actuator 130 is actuated to move the tools 120 into their forward axial position (FIGS. 5b, 16b). By actuating the translational movement mechanism 150 to move the insertion tools 120 into the second translation position (FIG. 7c), the tools 120 are moved into engagement with the lip 22c of the odd numbered boards 22, as shown in FIG. 16c. Thereafter, the insertion tools 120 are preferably individually moved into their retracted axial position (FIGS. 5d, 16d) by actuating the insertion tool actuators 130, unseating the odd numbered boards 22. The insertion tools 120 are then shifted back to their first translation position by actuating the translational movement mechanism 150, disengaging the boards 22, as shown in FIG. 16e.

Figure 7D:
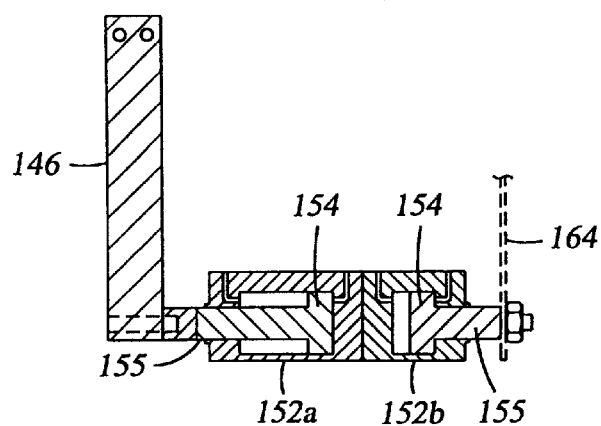

The insertion tools 120 are then rotated into the upright position (FIG. 8), moved into their third translation position (FIG. 7c), and rotated back into the horizontal position (FIG. 15), positioning the tools 120 between the odd and even numbered boards 22 (FIG. 16f). The above unseating sequence is then repeated, a difference being movement into the fourth translation position for engagement and unseating even numbered boards 22 (FIG. 7d). The same sequences as above are conducted for unseating the middle and lower rows 112, 114 of boards 22 (FIG. 14c, 14d), respectively.

While preferred embodiments of the present invention have been shown and described, modifications thereof can be made by one skilled in the art without departing from the spirit or teachings of this invention. The embodiments described herein are exemplary only and are not limiting. Many variations and modifications of this system and apparatus are possible and are within the scope of the invention. Accordingly, the scope of protection is not limited to the embodiments described herein.

What is claimed is:

1. An apparatus for electrically connecting at least one burn-in board with at least one electrical socket in a burn-in chamber, the burn-in board being at least partially disposed within the interior of the burn-in chamber, the burn-in chamber having an access opening, the apparatus comprising:

at least one insertion tool engageable with at least one of the at least one burn-in board, said at least one insertion tool being capable of moving the at least one burn-in board into connection with at least one of the at least one electrical socket in the burn-in chamber, and at least one automated insertion tool actuator connectable with said at least one insertion tool and capable of moving said at least one insertion tool in a manner that allows said at least one insertion tool to move the at least one burn-in board into connection with the at least one electrical socket in the burn-in chamber.

2. The apparatus of claim 1 including a plurality of insertion tools and a plurality of automated insertion tool actuators, each said automated insertion tool actuator connected with at least one of said insertion tools.

3. The apparatus of claim 2 including twelve insertion tools.

4. The apparatus of claim 2 wherein said plurality of insertion tools is capable of substantially simultaneously engaging a plurality of burn-in boards.

5. The apparatus of claim 2 wherein each said insertion tool is independently engageable with a burn-in board.

6. The apparatus of claim 1 wherein said automated insertion tool actuator includes a piston.

7. The apparatus of claim 1 wherein said automated insertion tool actuator is capable of moving said insertion tool within a plane substantially parallel to the plane within which lies the central axis of the burn-in board disposed in the burn-in chamber.

8. The apparatus of claim 7 wherein said automated insertion tool actuator is capable of moving said insertion tool in at least two distinct positions within a plane substantially parallel to the plane within which lies the central axis of the burn-in board disposed in the burn-in chamber.

9. The apparatus of claim 1 wherein said insertion tool is rotatable between at least a first position wherein said insertion tool faces the interior of the burn-in chamber, and a second position wherein said insertion tool does not face the interior of the burn-in chamber.

10. The apparatus of claim 1 further including an insertion tool rotation mechanism.

11. The apparatus of claim 10 wherein said insertion tool is rotatable with a range of approximately 90 degrees.

12. The apparatus of claim 10 wherein said insertion tool rotation mechanism includes at least one cylinder, said cylinder having a reciprocating rod.

13. The apparatus of claim 1 wherein said insertion tool is moveable laterally relative to the access opening of the burn-in chamber.

14. The apparatus of claim 13 further including an insertion tool translational movement mechanism.

15. The apparatus of claim 14 wherein said insertion tool translational movement mechanism includes at least one piston.

16. The apparatus of claim 15 wherein said insertion tool translational movement mechanism includes first and second pistons.

17. The apparatus of claim 14 wherein said insertion tool is moveable between at least three lateral positions relative to the access opening of the burn-in chamber.

18. The apparatus of claim 14 wherein said insertion tool is moveable between four distinct lateral positions relative to the access opening of the burn-in chamber.

19. The apparatus of claim 1 wherein said insertion tool is disposed in a carrier, wherein said carrier is connected with a burn-in chamber access opening covering.

20. The apparatus of claim 1 wherein said insertion tool is moveable vertically relative to the access opening of the burn-in chamber.

21. The apparatus of claim 20 further including an insertion tool vertical movement mechanism.

22. The apparatus of claim 21 wherein said insertion tool is moveable between at least three vertical positions relative to the access opening of the bun-in chamber.

23. The apparatus of claim 21 wherein said insertion tool vertical movement mechanism includes a chamber opening covering actuator.

24. The apparatus of claim 23 wherein said chamber opening covering actuator includes a motor, at least one chain guide rotatable by said motor, and at least one chain engageable with said chain guide.

25. The apparatus of claim 24 further including a shaft rotatable by said motor and a counterbalance spring associated with said shaft.

26. The apparatus of claim 1 wherein said insertion tool is capable of moving at least one burn-in board out of connection with at least one electrical socket in the burn-in chamber.

27. The apparatus of claim 26 wherein said insertion tool includes a hook-like member engageable with at least one bun-in board.

28. An apparatus for electrically connecting at least first and second printed circuit boards with electrical sockets in a chamber, the chamber having an access opening, the first printed circuit board being disposed at a first height at least partially within the chamber, the second printed circuit board being disposed at a second height at least partially within the chamber, the first height differing from the second height, the apparatus comprising:

a plurality of insertion tools, said plurality of insertion tools being moveable between at least two vertical positions relative to the access opening of the chamber, each said insertion tool engageable with at least one of the at least first and second printed circuit boards, said insertion tool being capable of moving the printed circuit board into connection with at least one electrical socket in the chamber, at least one insertion tool actuator connectable with at least one of said plurality of insertion tools, and an insertion tool vertical movement mechanism connectable with at least one of said plurality of insertion tools.

29. An apparatus for electrically connecting at least first and second printed circuit boards with electrical sockets in a chamber, the chamber having an access opening and at least two printed circuit board holders disposed at different heights within the chamber, the first and second printed circuit boards being at least partially disposed within printed circuit board holders at different heights within the chamber, the apparatus comprising:

means for seating the printed circuit boards within electrical sockets in the chamber, actuation means for moving said seating means in a manner that allows said seating means to connect the at least first and second printed circuit boards with the electrical sockets in the chamber, and vertical movement means for vertically moving said seating means.

30. The apparatus of claim 29 wherein said seating means includes means for gripping at least one printed circuit board to unseat the printed circuit board from at least one electrical socket in the chamber.

31. The apparatus of claim 29 further including rotational movement means for rotating said seating means between at least two positions relative to the access opening of the chamber.

32. The apparatus of claim 29, wherein said vertical movement means is capable of moving said seating means between at least two vertical positions relative to the access opening of the chamber.

33. The apparatus of claim 29, further including translational movement means for moving said seating means between at least two lateral positions relative to the access opening of the chamber.

34. An apparatus for disconnecting at least one printed circuit board from at least one socket in a chamber, the printed circuit board being at least partially disposed within the interior of the chamber, the apparatus comprising:

at least one extraction tool engageable with at least one printed circuit board, said at least one extraction tool being capable of moving the at least one printed circuit board out of connection with at least one socket in the chamber; and at least one automated extraction tool actuator connectable with said at least one extraction tool and capable of moving said at least one extraction tool in a manner that allows said at least one extraction tool to move the at least one printed circuit board out of connection with the at least one socket in the chamber.

35. An automated method for electrically connecting a plurality of printed circuit boards with a plurality of electrical sockets in a chamber, the printed circuit boards being at least partially disposed within the interior of the chamber, the printed circuit boards being positionable among at least two different heights within the chamber, first and second sets of the plurality of printed circuit boards positioned at a first height at least partially within in the chamber the chamber having an access opening, the method comprising:

aligning a plurality of insertion tools with the first set of printed circuit boards, extending each of the plurality of insertion tools through the access opening of the chamber to move each of the first set of printed circuit boards into connection with at least one electrical socket in the chamber, retracting the plurality of insertion tools, aligning the plurality of insertion tools with each of the second set of printed circuit boards, extending each of the plurality of insertion tools through the access opening of the chamber to move each of the second set of printed circuit boards into connection with at least one electrical socket in the chamber, and retracting the plurality of insertion tools.

36. The method of claim 35 wherein the plurality of printed circuit boards includes third and fourth sets of the plurality of printed circuit boards positioned at a second height in the chamber, further including moving the plurality of insertion tools vertically relative to the chamber, aligning the plurality of insertion tools with the third set of printed circuit boards, extending each of the plurality of insertion tools through the access opening of the chamber to move each of the third set of printed circuit boards into connection with at least one electrical socket in the chamber, retracting the plurality of insertion tools, aligning the plurality of insertion tools with the fourth set of printed circuit boards, extending each of the plurality of insertion tools through the access opening of the chamber to move each of the fourth set of printed circuit boards into connection with at least one electrical socket in the chamber, and retracting the plurality of insertion tools.

37. The method of claim 36 further including vertically moving in unison the chamber opening covering and the plurality of insertion tools relative to the access opening of the chamber.

38. The method of claim 35 further including connecting the plurality of insertion tools with a chamber opening covering.

39. The method of claim 35 further including moving the plurality of insertion tools into a position wherein the plurality of insertion tools does not face the access opening of the chamber.

40. An apparatus for electrically connecting at least one printed circuit board with at least one electrical socket in a chamber, the at least one printed circuit board being at least partially disposed within the interior of the chamber, the chamber having an access opening, the apparatus comprising:

at least two insertion tools engageable with the at least one printed circuit board, said at least two insertion tools being capable of moving at least one of the at least one printed circuit board into connection with at least one electrical socket in the chamber, and at least one insertion tool actuator connectable with said at least two insertion tools.

41. The apparatus of claim 40, wherein the apparatus for electrically connecting at least one printed circuit board with at least one electrical socket in a chamber is automated, and wherein each of said at least two insertion tools is capable of engaging adjacent printed circuit boards.

42. The apparatus of claim 41, wherein the chamber is a burn-in chamber and the printed circuit boards are burn-in boards, and wherein each of said at least two insertion tools is capable of engaging first and second burn-in boards disposed at different heights in the burn-in chamber.

43. The apparatus of claim 42, further including at least six insertion tools.

44. The apparatus of claim 42, wherein each of said at least two insertion tools is capable of moving at least one of the at least one printed circuit board out of connection with the at least one electrical socket in the chamber.

45. A method for electrically connecting at least one printed circuit board with at least one electrical socket in a chamber with the use of at least one insertion tool engageable with the at least one printed circuit board, and with the use of at least one automated insertion tool actuator capable of moving the at least one insertion tool in a manner that allows the at least one insertion tool to move the at least one printed circuit board into connection with the at least one electrical socket in the chamber, the at least one printed circuit board being at least partially disposed within the interior of the chamber, the chamber having an access opening, the method comprising:

aligning the at least one insertion tool with the at least one printed circuit board, actuating the at least one automated insertion tool actuator, wherein the at least one insertion tool is movable in a manner that moves the at least one printed circuit board into connection with the at least one electrical socket in the chamber, and retracting the at least one insertion tool.

46. The method of claim 45 wherein the chamber includes at least a first and a second printed circuit board disposed at different vertical positions in the chamber, further including moving the insertion tool between at least two vertical positions relative to the access opening of the chamber.

47. The method of claim 45 further including gripping at least one of the at least one printed circuit board with the at least one of the at least one insertion tool, the at least one printed circuit board being at least partially connected with at least one electrical socket in the chamber and retracting the at least one insertion tool to move the at least one printed circuit board out of connection with the at least one electrical socket in the chamber.

48. An apparatus for disconnecting a plurality of printed circuit boards from a plurality of sockets in a chamber, wherein first and second printed circuit boards are at least partially disposed within the chamber at different heights in the chamber, the apparatus comprising:

at least one disconnecting tool engageable with at least one printed circuit board and capable of moving the at least one printed circuit board out of connection with at least one socket in the chamber; and an automated vertical movement mechanism connectable with said at least one disconnecting tool and capable of moving said at least one disconnecting tool from a position in vertical alignment with the first printed circuit board to a position in vertical alignment with the second printed circuit board.

49. An apparatus capable of performing at least one among the actions of seating and unseating at least one printed circuit board in a chamber, the at least one printed circuit board at least partially disposed within the chamber and accessible through a front opening of the chamber, the front opening of the chamber being disposed in a vertical plane, the apparatus comprising:

at least one seating-unseating tool engageable with at least one printed circuit board and capable of performing at least one among the actions of seating and unseating the at least one printed circuit board in the chamber; and a rotation mechanism connected with said at least one seating-unseating tool, wherein said rotation mechanism is capable of rotatably moving said at least one seating-unseating tool between at least first and second positions, whereby, in said first position, said at least one seating-unseating tool in not capable of extending through the vertical plane of the chamber opening and is not capable of engaging a printed circuit board disposed in the chamber, and in said second position, said at least one seating-unseating tool is capable of extending through the vertical plane of the chamber and engaging at least one printed circuit board disposed at least partially in the chamber.

50. The apparatus of claim 49 wherein said at least one seating-unseating tool includes at least one printed circuit board engagement member, wherein said at least one printed circuit board engagement member is oriented generally vertically when said at least one seating-unseating tool is in said first position, and is oriented generally horizontally when said at least one seating-unseating tool is in said second position.

51. The apparatus of claim 50 wherein said rotation mechanism includes first and second rotational cylinders, wherein said at least one seating-unseating tool is disposed in a housing connected with said first and second rotational cylinders.

52. An apparatus capable of connecting and disconnecting a plurality of printed circuit boards with a plurality of sockets in a chamber, the chamber located within a housing, the apparatus comprising:
 at least one automated seating-unseating device engageable with at least one printed circuit board, whereby said at least one automated seating-unseating device is capable of moving at least one printed circuit board into connection with at least one socket in the chamber and moving at least one printed circuit board out of connection with at least one socket in the chamber, and
 wherein said at least one automated seating-unseating device is connectable with said housing at all times, including during operation of the chamber and during operation of said at least one automated seating-unseating device.

53. An apparatus capable of connecting and disconnecting at least one printed circuit board with at least one socket in a chamber, the at least one printed circuit board being at least partially disposed within the chamber, the apparatus comprising:
 at least one automated connection-disconnection tool engageable with at least one printed circuit board, said at lest one automated connection-disconnection tool being movable between at least three positions including a first retracted position, a second partially extended position and a third extended position,
 wherein said at least one automated connection-disconnection tool is capable of moving from said first retracted position to said second partially extended position to move at least one printed circuit board into connection with at least one socket in the chamber, and
 wherein said at least one automated connection-disconnection tool is capable of moving from said third extended position to said first retracted position to move at least one printed circuit board out of connection with at least one socket in the chamber.

54. An apparatus for positioning at least one printed circuit board engagement device so that the engagement device is capable of moving at least two printed circuit boards into and out of connection with at least two sockets in a chamber, the chamber having an opening, wherein first and second printed circuit boards are disposed at least partially in the chamber adjacent to one another from left to right, each of the first and second printed circuit boards having a first side facing the opening of the chamber, the apparatus comprising:
 a translational movement mechanism engageable with each at least one printed circuit board engagement device, said translational movement mechanism being moveable between at least four positions,
 wherein a first position of said translational movement mechanism positions a first printed circuit board engagement device to the left of the first printed circuit board, a second position of said translational movement mechanism aligns the first printed circuit board engagement device with the first side of the first printed circuit board, a third position of said translational movement mechanism positions the first printed circuit board engagement device between the first and second printed circuit boards, and a fourth position of said translational movement mechanism aligns the first printed circuit board engagement device with the first side of the second printed circuit board.

55. The apparatus of claim 54 wherein movement of said translational movement mechanism from said first position to said second position enables the first printed circuit board engagement device to engage the first printed circuit board when the first printed circuit board is connected with at least one socket in the chamber, and wherein movement of said translational movement mechanism from said third position to said fourth position enables the first printed circuit board engagement device to engage the second printed circuit board when the second printed circuit board is connected with at least one socket in the chamber.

56. The apparatus of claim 54 wherein said second position of said translational movement mechanism disposes the first printed circuit board engagement device in position to engage the first printed circuit board and to move it into connection with at least one socket in the chamber when the first printed circuit board is not connected with at least one socket in the chamber, and wherein said fourth position of said translational movement mechanism disposes the first printed circuit board engagement device in position to engage the second printed circuit board and to move it into connection with at least one socket in the chamber when the second printed circuit board is not connected with at least one socket in the chamber.

57. The apparatus of claim 54 wherein third and fourth printed circuit boards are at least partially disposed within the chamber adjacent to one another from left to right in the chamber, each of the third and fourth printed circuit boards having a first side facing the opening of the chamber, and wherein said first position of said translational movement mechanism positions a second printed circuit board engagement device to the left of the third printed circuit board, said second position of said translational movement mechanism aligns the second printed circuit board engagement device with the first side of the third printed circuit board, said third position of said translational movement mechanism positions the second printed circuit board engagement device between the third and fourth printed circuit boards, and said fourth position of said translational movement mechanism aligns the second printed circuit board engagement device with the first side of the fourth printed circuit board.

58. The apparatus of claim 57 wherein each of a plurality of printed circuit board engagement devices is simultaneously alingable with one of a first set of printed circuit boards when said translational movement mechanism is in said second position, and each of the plurality of printed circuit board engagement devices is simultaneously alingable with one of a second set of printed circuit boards when said translational movement mechanism is in said fourth position.

59. The apparatus of claim 58 wherein said translational movement mechanism includes first and second pneumatic cylinders.

60. An apparatus for preventing the exertion of excessive force on at least one printed circuit board during automated connection of at least one printed circuit board with at least one socket in a chamber, the at least one printed circuit board being at least partially disposed within the chamber, the apparatus comprising:

at least one seating tool engageable with at least one printed circuit board, said at least one seating tool being laterally movable in a plane within which the at least one printed circuit board is movable and engageable with at least one socket in the chamber, said at least one seating tool being capable of pushing the at least one printed circuit board into engagement with the at least one socket;

at least one seating tool actuator connectable with said at least one seating tool and capable of moving said at least one seating tool in opposing lateral directions; and at least one sensor associated with said at least one seating tool and said at least one seating tool actuator, wherein said at least one sensor is capable of detecting the lateral position of said at least one seating tool when said at least one seating tool is moving in a lateral direction and is further capable of providing a signal to cause said at least one seating tool to stop moving in that lateral direction.

* * * * *

UNITED STATES PATENT AND TRADEMARK OFFICE
CERTIFICATE OF CORRECTION

PATENT NO : 6,166,555
DATED : December 26, 2000
INVENTOR(S): Charles Lillja; and David Roy Hugh It is certified that error appears in the above-identified patent and that said Letters Patent is hereby corrected as shown below:

In the Claims:

Claim 35, col. 20, line 47, please delete "in the chamber", and insert therefor "the chamber,".

Claim 49, col. 22, line 63, after "chamber", please insert "opening".

Claim 51, col. 23, line 10, after "housing", please insert ", said housing being".

Claim 53, col. 23, line 35, please delete "lest", and insert therefor "least".

Signed and Sealed this

Eighth Day of May, 2001

NICHOLAS P. GODICI

*Attest:*

*Attesting Officer*    Acting Director of the United States Patent and Trademark Office